(12) United States Patent
Takahashi et al.

(10) Patent No.: US 7,019,438 B2
(45) Date of Patent: Mar. 28, 2006

(54) PIEZOELECTRIC/ELECTROSTRICTIVE FILM DEVICE

(75) Inventors: Nobuo Takahashi, Kasugai (JP); Yuki Bessho, Nishikasugai-gun (JP)

(73) Assignee: NGK Insulators, Ltd., Nagoya (JP)

( * ) Notice: Subject to any disclaimer, the term of this patent is extended or adjusted under 35 U.S.C. 154(b) by 73 days.

(21) Appl. No.: 10/463,163

(22) Filed: Jun. 17, 2003

(65) Prior Publication Data

US 2003/0234595 A1 Dec. 25, 2003

Related U.S. Application Data

(60) Provisional application No. 60/394,386, filed on Jul. 8, 2002.

(30) Foreign Application Priority Data

| Jun. 21, 2002 | (JP) | ............................. 2002-182212 |
| Jul. 26, 2002 | (JP) | ............................. 2002-218857 |
| Oct. 11, 2002 | (JP) | ............................. 2002-299382 |
| Jan. 14, 2003 | (JP) | ............................. 2003-005714 |
| Jun. 13, 2003 | (JP) | ............................. 2003-169552 |

(51) Int. Cl.
*H01L 41/08* (2006.01)

(52) U.S. Cl. ...................... 310/324; 310/330; 310/332; 310/328

(58) Field of Classification Search ................ 310/328, 310/330–332, 324
See application file for complete search history.

(56) References Cited

U.S. PATENT DOCUMENTS

| 5,376,857 | A | * | 12/1994 | Takeuchi et al. ............. 310/328 |
| 5,381,171 | A | * | 1/1995 | Hosono et al. ................ 347/72 |
| 5,469,012 | A | * | 11/1995 | Suzuki et al. ................ 310/348 |
| 5,594,292 | A | * | 1/1997 | Takeuchi et al. ............. 310/324 |
| 5,814,920 | A | * | 9/1998 | Takeuchi et al. ............. 310/330 |
| 6,584,660 | B1 | * | 7/2003 | Shimogawa et al. ........ 29/25.35 |

FOREIGN PATENT DOCUMENTS

| JP | 04-085976 | 3/1992 |
| JP | 05-124188 | 5/1993 |
| JP | 06-260694 | 9/1994 |
| JP | 09-162452 | 6/1997 |
| JP | 2000-210615 | 8/2000 |

\* cited by examiner

*Primary Examiner*—Mark Budd
(74) *Attorney, Agent, or Firm*—Burr & Brown

(57) ABSTRACT

A piezoelectric/electrostrictive film device is provided, including a ceramic substrate, and a piezoelectric/electrostrictive actuator including a lower electrode, a piezoelectric/electrostrictive layer and an upper electrode that are sequentially layered on the substrate. The piezoelectric/electrostrictive layer covers an upper surface of the lower electrode and a lower surface of the upper electrode and protrudes over edges thereof. The protruded portions of the piezoelectric/electrostrictive layer are coupled to the substrate via a coupling member.

22 Claims, 17 Drawing Sheets

PIEZOELECTRIC/ELECTROSTRICTIVE FILM DEVICE

BACKGROUND OF THE INVENTION AND DESCRIPTION OF THE RELATED ART

The present invention relates to piezoelectric/electrostrictive film devices, and more specifically relates to piezoelectric/electrostrictive film devices having a configuration adopted for having larger resonant frequency while being capable of maintaining flexural displacement equal to or superior to that of conventional devices.

In recent years, piezoelectric/electrostrictive film devices are employed for variety of applications such as displacement control devices, solid device motors, ink-jet printer heads, relays, switches, shutters, pumps or fins. Such piezoelectric/electrostrictive film devices have better characteristics including capability of controlling micro-displacement, as well as higher electric/mechanical transducing efficiency, rapid response, higher durability and lower power consumption, and more recently, more rapid response is required in applications of ink-jet printer heads and the like which require improved printing quality and/or printing speed and so on.

In the meantime, such piezoelectric/electrostrictive film devices generally comprise a configuration having a substrate comprising a ceramic on which a lower electrode, a piezoelectric/electrostrictive layer, and an upper electrode are sequentially layered thereon, and for the purpose of avoiding dielectric breakdown of piezoelectric/electrostrictive film layer by ensuring insulation between both electrodes, piezoelectric/electrostrictive film devices 30 was developed which comprises piezoelectric/electrostrictive layer 73 which covers the upper surface of lower electrode 77 and an edge of which protrudes upon substrate 44, as shown in FIG. 17 (see JP-A-6-260694).

Also, although protruded portion 79 of the piezoelectric/electrostrictive layer can be directly fixed to substrate 44 which comprises alumina and the like, such type of configuration provides a problem of decreasing flexural displacement because such configuration provides both edges of piezoelectric/electrostrictive layer 73 being fixed to disturb its extension and contraction. (Piezoelectric/electrostrictive layer extends and contracts in the direction perpendicular to thickness by applying electric voltage.) For this reason, it is common for conventional piezoelectric/electrostrictive film device 30 to provide protruded portion 79 of the piezoelectric/electrostrictive layer in a manner of being incompletely coupled to substrate 44 (See JP-A-6-260694).

Further, it is disclosed that a predetermined resin layer are formed between protruded portion 79 of the piezoelectric/electrostrictive layer 73 and substrate 44 in conventional piezoelectric/electrostrictive film device 30 for the purpose of preventing disconnection of upper electrode 75 due to the presence of the discontinuous face caused between protruded portion 79 of the piezoelectric/electrostrictive layer 73 and substrate 44 both of which are provided in the manner of being incompletely coupled (See JP-A-6-260694).

However, it was never considered to have larger stiffness of the device for such type of piezoelectric/electrostrictive device, on the basis of the understanding that the coupling between the protruded portion of the piezoelectric/electrostrictive layer and the substrate adversely affects the flexural displacement or the generative force, and therefore the device is not exactly enough applicable to the requirement in recent time of being capable of achieving more rapid response.

More specifically, the conventional piezoelectric/electrostrictive device provides substantially no contribution to an improvement on the stiffness of the devices, since most of aforementioned resin layers have much lower hardness (approximately 1.5 μm of penetration depth of a Microvickers hardness indenter) than that of ceramic or metallic materials of which the piezoelectric/electrostrictive layer composes, and thus the device is not exactly enough applicable to the requirement in recent time of having larger resonant frequency while having flexural displacement equal to or superior to that of conventional devices, and being capable of achieving more rapid response.

Furthermore, in the case of piezoelectric/electrostrictive film device, since a plurality of piezoelectric/electrostrictive film devices are ordinarily installed on the same substrate as a piezoelectric/electrostrictive actuator which works as an ink discharging pump in the ink jet printers or the like, the piezoelectric/electrostrictive characteristics such as the flexural displacement, the resonant frequency and the like are required to be homogenous among the individual piezoelectric/electrostrictive film devices (individual piezoelectric/electrostrictive actuators). On the contrary, however, there is a problem that the aforementioned piezoelectric/electrostrictive devices having a protruded portion of the piezoelectric/electrostrictive layer show a big fluctuation in the piezoelectric/electrostrictive characteristics such as the flexural displacement, the resonant frequency and the like among the individual piezoelectric/electrostrictive devices (individual piezoelectric/electrostrictive actuators). In other words, in the case of the piezoelectric/electrostrictive devices having a protruded portion of the piezoelectric/electrostrictive layer, since it is quite difficult to control precisely the size and the shape of the protruded portion, and the shape and size of the gap being present between the protruded portion and the substrate, the fluctuation in these shapes and sizes is attributed to the cause of the fluctuation in the piezoelectric/electrostrictive characteristics such as the flexural displacement, the resonant frequency and the like.

SUMMARY OF THE INVENTION

The present invention has been made taking the foregoing problems into consideration, and an object thereof is to provide a piezoelectric/electrostrictive film device having larger resonant frequency while having flexural displacement which is equal to or superior to that of conventional piezoelectric/electrostrictive film device, and being excellent in rapid response.

The present inventors have found, as a result of our various investigations carried out for the purpose of solving the problems indicated above, that a piezoelectric/electrostrictive film device having larger resonant frequency while involving no decrease of flexural displacement which has been considered to be inevitably caused in the prior art is obtainable by coupling a protruded portion of a piezoelectric/electrostrictive layer to a substrate via a coupling member made of a specific material such as a material having a specific penetration depth of a Microvickers indenter, and further found that the piezoelectric/electrostrictive film device having characteristics listed above can provide a piezoelectric/electrostrictive film device of being excellent in rapid response while having a flexural displacement that is equal to or superior to that of conventional piezoelectric/ electrostrictive film device, and thus the present invention is completed.

More specifically, the present invention provides a piezoelectric/electrostrictive film device comprising a substrate comprising ceramics, and a piezoelectric/electrostrictive actuator including a lower electrode, a piezoelectric/electrostrictive layer and an upper electrode that are sequentially layered on the substrate, the piezoelectric/electrostrictive layer covering an upper surface of the lower electrode and a lower surface of the upper electrode and protruding over edges thereof, characterized in that the protruded portion of the piezoelectric/electrostrictive layer is coupled to the substrate via a coupling member, and flexural displacement of the present device is substantially same as, and resonant frequency of the present device is larger by not less than 3% than, that of a piezoelectric/electrostrictive film device comprising same materials and same configuration as the present device but including no coupling member.

Also, the present invention provides a piezoelectric/electrostrictive film device comprising a substrate comprising ceramics, and a piezoelectric/electrostrictive actuator including a laminate layer being formed by layering a predetermined number of lower electrodes, a predetermined number of piezoelectric/electrostrictive layers, and a predetermined number of the upper electrodes alternately in order on the substrate, each of the piezoelectric/electrostrictive layers covering upper surfaces of each of the lower electrodes and the lower surfaces of each of the upper electrodes and protruding over edges thereof, respectively, characterized in that the protruded portions of the piezoelectric/electrostrictive layers are coupled to the substrate via a coupling member, flexural displacement of the present device is substantially same as, and resonant frequency of the present device is larger by not less than 3% than, that of a piezoelectric/electrostrictive film device comprising same materials and same configuration as the present device but including no coupling member.

Here, the "protruded portion of the piezoelectric/electrostrictive layer" means a portion of the lower and the upper surfaces of the piezoelectric/electrostrictive layer that are not in contact with upper or lower surfaces of each of the electrodes.

The coupling member of the each of aforementioned piezoelectric/electrostrictive film devices preferably comprise a material, penetration depth of a Microvickers hardness indenter of which is larger than that of the piezoelectric/electrostrictive layer and lower than 1.3 μm. The coupling member of each of the aforementioned piezoelectric/electrostrictive film devices has preferably a Young's modulus lower than that of the piezoelectric/electrostrictive layer, but preferably exceeding 2.4 GPa.

Here, the term "penetration depth of Microvickers hardness indenter" in the present specification means an indenter penetration depth measured using a micro hardness tester and a Diamond Vickers indenter having a diagonal angle of 136 degree at a load of 1 gf and a penetration speed of 0.145 gf/sec. Additionally, the term "Young's modulus" in the present specification means the value calculated by the following equation (1):

$$E = k \cdot P/\delta^2 \quad (1)$$

wherein E denotes Young's modulus (GPa), P denotes load applied (μm), δ denotes indenter penetration depth measured with a penetration speed of 0.145 gf/sec., and k denotes a constant given by the following equation (2):

$$k = 3.5\pi(1-v^2)/\tan\alpha \quad (2)$$

wherein a denotes one half of a diagonal angle of an apex portion of the indenter, and v denotes a Poisson's ratio of a material.

The material having such a penetration depth of a Microvickers hardness indenter and a Young's modulus is preferably an organic-inorganic hybridized material.

Further, the above-mentioned piezoelectric/electrostrictive film device preferably includes the coupling member being layered at least between the protruded portion of the piezoelectric/electrostrictive layer thereby coupling the lower surface of the protruded portion to the substrate, more preferably include the coupling member being layered to cover at least the upper and lower surfaces of the protruded portion of the piezoelectric/electrostrictive layer thereby coupling at least the upper and lower surfaces of the protruded portion to the substrate, and most preferably include the coupling member being layered to cover the whole protruded portion of the piezoelectric/electrostrictive layer thereby coupling at least the whole protruded portion of the piezoelectric/electrostrictive layer to the substrate via the coupling member. Further, the coupling member of the piezoelectric/electrostrictive film device preferably comprises an insulative material.

Further, in the case of the aforementioned piezoelectric/electrostrictive film device, the aforementioned coupling member preferably includes a pigment, more preferably a fluorescent pigment, most preferably an organic pigment that is removable, degradable, or becomes inactive by a physical treatment such as heating at a temperature higher than the ambient temperature or a chemical treatment inclusive of reaction with other components used for the coupling member and the like or oxygen in air without causing any adverse affects on the device. Moreover, the aforementioned piezoelectric/electrostrictive film device preferably includes a plurality of piezoelectric/electrostrictive actuators, and at least two piezoelectric/electrostrictive actuators are coupled with at lease one coupling member. Furthermore, said at lease one coupling member which couples at least two piezoelectric/electrostrictive actuators preferably includes a portion formed on the substrate between said at least two piezoelectric/electrostrictive actuators.

DETAILED DESCRIPTION OF THE INVENTION

Figure 1:
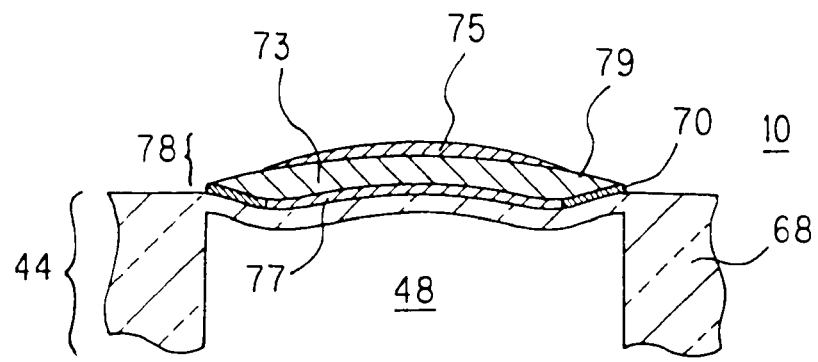
FIG. 1 is a partially cross-sectional view showing an embodiment of the present invention.

The embodiments of the piezoelectric/electrostrictive film device of the present invention will be specifically described in detail below, and the present invention should not be construed as being limited by these embodiments, and various changes, modifications and improvements can be added on the basis of ordinary knowledge of a person having ordinary skill in the art without departing from the scope of the present invention.

As shown in FIGS. 1 to 6, the piezoelectric/electrostrictive film device 10 according to the present invention comprises a substrate 44 comprising ceramics, and a piezoelectric/electrostrictive actuator 78 including a lower electrode 77, a piezoelectric/electrostrictive layer 73 and an upper electrode 75 that are sequentially layered on the substrate. The piezoelectric/electrostrictive layer 73 covers an upper surface of the lower electrode 77 and a lower surface of the upper electrode 75 and protrudes over edges thereof. For multi-layer piezoelectric/electrostrictive film devices 20 of the present invention shown in FIGS. 4 to 6, for example, the piezoelectric/electrostrictive actuator 78 includes a plurality of electrodes 75–77 and a plurality of piezoelectric/electrostrictive layers 71, 72 that are alternately layered on the substrate 44. Each of the piezoelectric/electrostrictive layers 71, 72 cover the upper and lower surfaces of each of the electrodes 75–77 and protrude over edges thereof, respectively. The protruded portion 79 of the piezoelectric/electrostrictive layer 73 (71, 72) is coupled to the substrate 44 via a coupling member 70 such that the flexural displacement of the present device is substantially the same as, and the resonant frequency of the present device is at least 3% larger than that of a piezoelectric/electrostrictive film device comprising the same materials and having the same configuration as the present device but that does not include coupling member 70.

This provides the piezoelectric/electrostrictive film device having a flexural displacement that is equal to or superior to that of the conventional piezoelectric/electrostrictive film device, while being excellent in rapid response. Furthermore, in the case of the present invention, since the gap formed between the protruded portion 79 of the piezoelectric/electrostrictive layer 73 (71, 72) and the substrate 44 is filled with the coupling member 70, piezoelectric/electrostrictive devices used as the actuators 78 after the provision of the coupling member 70 have practically the same size and the same shape each other, even though a fluctuation exists more or less in the sizes and the shapes of the protruded portion, and those of the gap between the protruded portions and the substrates of the individual devices. Consequently, the fluctuation in the piezoelectric/electrostrictive characteristics such as the flexural displacement, the resonant frequency and the like derived from the fluctuation in the sizes and the shapes of the protruded portion 79 are reduced, and resultantly, piezoelectric/electrostrictive devices 10 (20) always have practically homogenous piezoelectric/electrostrictive characteristics. Specific description of each of the constituent parts is included below.

As shown in FIGS. 1 to 6, the substrate 44 of the present invention includes, for example, an integrated configuration of a thin portion 66 having a sheet-like shape and a fixed portion 68 comprising a thick ceramic member. Also, the thin portion 66 of the substrate 44 is firmly fixed to the fixed portion 68 at a location excluding locations on which piezoelectric/electrostrictive layer 73 is mounted, and a cavity 48 is normally provided on the lower part of the thin portion 66 at a location corresponding to the location on which piezoelectric/electrostrictive layer 73 is mounted.

Figure 2:
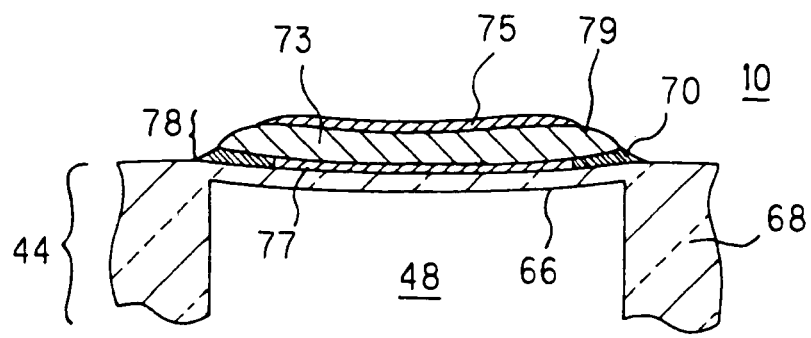
FIG. 2 is a partially cross-sectional view showing another embodiment of the present invention.
Figure 3:
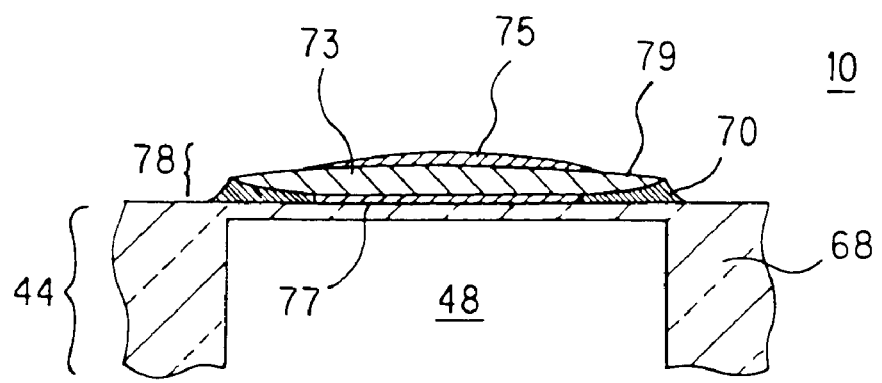
FIG. 3 is a partially cross-sectional view showing yet another embodiment of the present invention.
Figure 4:
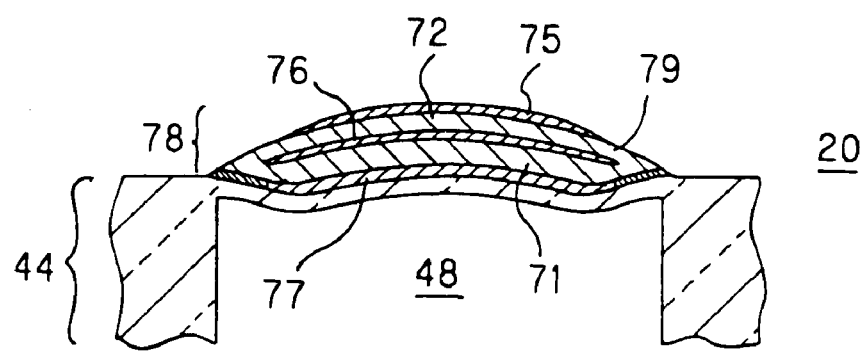
FIG. 4 is a partially cross-sectional view showing an embodiment for the multi-layer piezoelectric/electrostrictive film device of the present invention.
Figure 5:
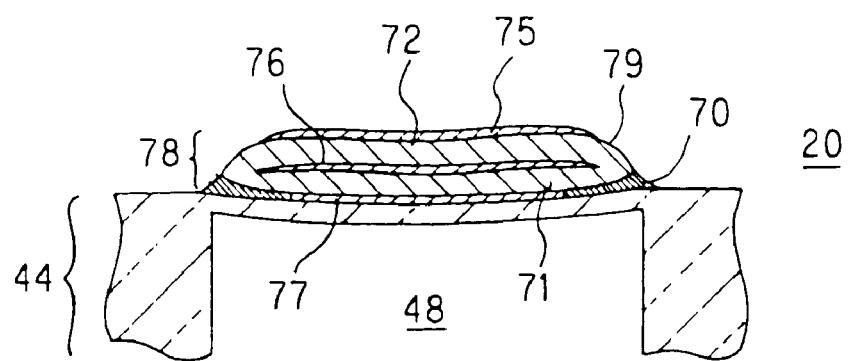
FIG. 5 is a partially cross-sectional view showing another embodiment for the multi-layer piezoelectric/electrostrictive film device of the present invention.
Figure 6:
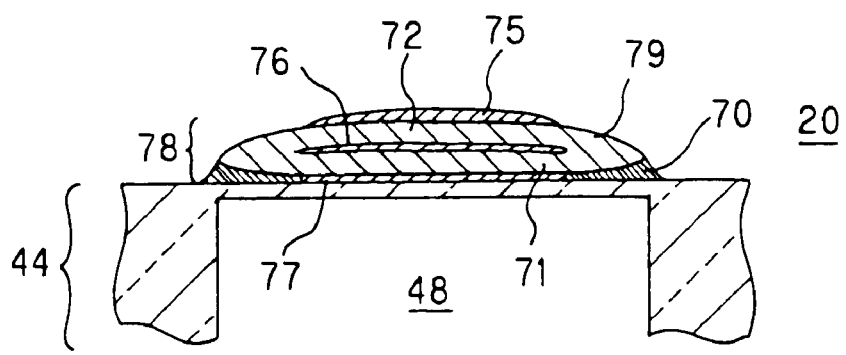
FIG. 6 is a partially cross-sectional view showing yet another embodiment for the multi-layer piezoelectric/electrostrictive film device of the present invention.
Figure 7:
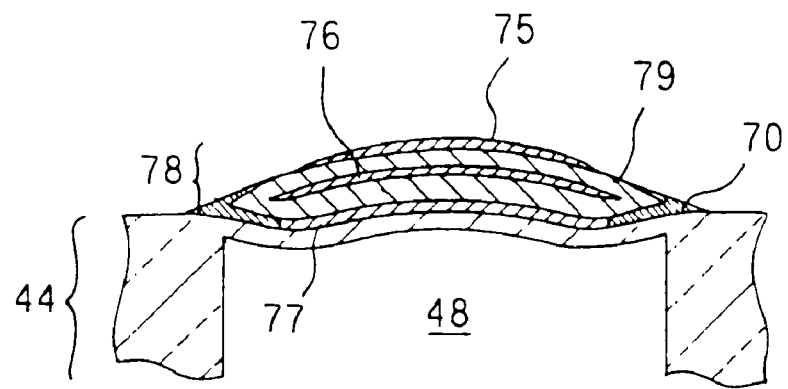
FIG. 7 is a partially cross-sectional view showing yet another embodiment for the multi-layer piezoelectric/electrostrictive film device of the present invention.
Figure 8:
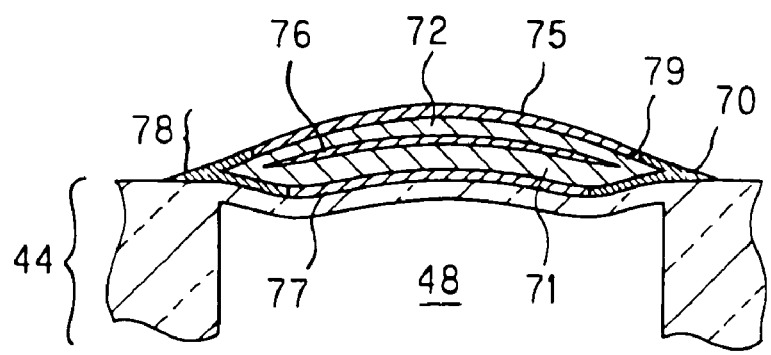
FIG. 8 is a partially cross-sectional view showing yet another embodiment for the multi-layer piezoelectric/electrostrictive film device of the present invention.

Also, as shown in FIGS. 3 and 6, the thin portion 66 may be a flat plate having a perpendicular cross section of rectangular shape. Preferably, the thin portion 66 has a shape in which central part thereof is inflected toward the cavity 48, as shown in FIGS. 2 and 5, or in which a perpendicular cross section thereof is "W" shaped as shown in FIGS. 1 and 4, in view of achieving larger flexural displacement, and the "W" shaped configuration is most preferable. Additionally, the thin portion 66 having the inflected shape shown in FIGS. 2 and 5 or having the "W" shape shown in FIGS. 1 and 4, can be formed by utilizing shrinkage of piezoelectric/electrostrictive layer in the latitudinal direction during the firing process of the piezoelectric/electrostrictive layer 73, or by adjusting the timing in the firing shrinkage of the upper portion and that of the lower portion of the piezoelectric/electrostrictive layer 73, the quantity of the firing shrinkage, or the design of the thin portion 66.

The thickness of the thin portion 66 according to the present invention is preferably selected within a range which prevents a decrease in the flexural displacement of the piezoelectric/electrostrictive layer due to a increase of stiffness while maintaining sufficient strength of the device. More specifically, thickness in a range of 1 µm –50 µm is preferable, a range of 3–50 µm is more preferable, and a range of 3–12 µm is most preferable. Additionally, the thickness of the fixed portion 68 is at least 10 µm, and more preferably, 50 µm or more.

Also, the shape of the surface of the substrate 44 on which the piezoelectric/electrostrictive actuator 78 is mounted is not limited to rectangular shape, and may be circular shape, or other polygonal shape than tetragon, such as trigon and so on.

The substrate 44 according to the present invention may comprise ceramics, and is preferably made of a material having better heat resistance and chemical stability, which is not degraded during the thermal processing of the piezoelectric/electrostrictive layer 73 or the electrodes 75, 77 layered on the substrate 44. Also, the substrate 44 is preferably made of an electrically insulative material in order to electrically isolate lines to the lower electrode 77 that are formed on the substrate 44. More specifically, the material of the substrate 44 is at least one material selected from a group consisting of, for example, stabilized zirconium oxide, aluminum oxide, magnesium oxide, titanium oxide, spinel, mullite, aluminum nitride, silicon nitride, and glass. Among these, a material including stabilized zirconium oxide is preferable, in view of providing larger mechanical strength and better toughness thereby improving the durability of the thin portion that is necessarily thin and vibration is applied, and in view of providing higher chemical stability thereby providing very low reactivity with the piezoelectric/electrostrictive layer 73 and the electrodes 75,77.

Also, the stabilized zirconium oxide may additionally include a stabilizer such as calcium oxide, magnesium oxide, yttrium oxide, scandium oxide, ytterbium oxide, cerium oxide or oxides of rare earth metals. Further, the additional quantity of these stabilizers is preferably 1–30 mol %, and more preferably 1.5–10 mol % for yttrium oxide and ytterbium oxide; preferably 6–50 mol % and more preferably 8–20 mol % for cerium oxide and preferably 5–40% by mol and more preferably 5–20 mol % for calcium oxide and magnesium oxide. Further, a stabilizer additionally containing yttrium oxide is most preferable among these stabilizers, and the additional quantity thereof is preferably 1.5–10 mol %, and more preferably, 2–4 mol %.

Also, the material of the thin portion 66 may additionally include a chemical component such as silicon oxide or boron oxide, which is included in clays, besides the ceramics listed above. However, an excessive addition of these components may induce a chemical reaction between the substrate 44 and the piezoelectric/electrostrictive layer 73, so that it is difficult to maintain a specific formulation of the piezoelectric/electrostrictive layer 73, thereby causing the deterioration of the piezoelectric/electrostrictive characteristics. Therefore, the component such as silicon oxide or boron oxide which is included in clays included in the thin portion 66 of the substrate 44 according to the present invention is preferably 20 wt % or less of the thin portion 66, and more preferably 3 wt % or less. Further, the ceramics of the thin portion 66 preferably have crystallized grain mean particle size in a range of 0.05–2 µm in view of enhancing the mechanical strength of the thin portion 66, and more preferably, in a range of 0.1–1 µm.

Next, the electrodes according to the present invention include at least one pair comprising the upper electrode 75 and the lower electrode 77, which are layered upon the upper surface and the lower surface of the piezoelectric/electrostrictive layer 73, respectively, to sandwich the piezoelectric/electrostrictive layer 73, as shown in FIGS. 1 to 3. Further, in the case of multi-layer piezoelectric/electrostrictive layer 20, as shown in FIGS. 4 to 9, each of the electrodes are alternately layered with each layer of a plurality of the piezoelectric/electrostrictive layers 71, 72, and the electrodes 75 and 77 are layered on the top and the bottom, respectively, of the multi-layer configuration of the piezoelectric/electrostrictive layer 71, 72 and the electrodes 75–77.

In particular, since the piezoelectric/electrostrictive film device 20 having the multi-layer configuration shown in FIGS. 4 to 9 comprises the electrodes 75 and 77 layered on the top and the bottom, respectively, in addition to comprising the multi-layer configuration of the piezoelectric/electrostrictive layer 71, 72 and the electrodes 75–77, the flexural displacement of the piezoelectric/electrostrictive actuator 78 definitely increases, and further, the stiffness of the whole piezoelectric/electrostrictive actuator 78 increases, and the piezoelectric/electrostrictive film device having very large resonant frequency and capability of rapid response can be presented by the synergism with the coupling member which will be described later.

The thickness of the electrodes 75, 77 (75–77) of the present invention may be selected to be an adequate value in accordance with applications, and is preferably a thickness of no greater than 15 aim, and more preferably, not greater than 5 µm, since an excessively thick electrode may act as a relaxation layer thereby readily lowering the flexural displacement.

In addition, the material for the electrodes 75, 77 (75–77) may preferably be a material which is solid at room temperature, resistant to high temperature oxidation atmospheres employed in the firing process for integration of the electrode and the substrate and/or piezoelectric/electrostrictive layer, and which has better electrical conductivity. More specifically, the material for the electrodes is, for example, a metal such as aluminum, titanium, chromium, iron, cobalt, nickel, copper, zinc, niobium, molybdenum, ruthenium, palladium, rhodium, silver, tin, tantalum, tungsten, iridium, platinum, gold or lead, or alloys thereof. In addition, the electrodes can be made of a cermet material including the same material as that of the piezoelectric/electrostrictive layer or the aforementioned substrate 44 that is dispersed into the metals listed above.

Furthermore, in the case of the multi-layer piezoelectric/electrostrictive film device 20, as shown in FIG. 4, for example, the electrode 77 located at the lowest layer and the intermediate electrodes disposed between the individual piezoelectric/electrostrictive layers 71 and 72 are preferably composed of a material containing an additive such as zirconium oxide, cerium oxide, titanium oxide or the like in an electrode material containing platinum as a major component. The reason therefor is not clear, however, the peeling between the electrodes 76 and 77, and the piezoelectric/electrostrictive layers 71 and 72 can be effectively prevented by employing the material mentioned above. It is preferable to add 0.01 mass % to 20 mass % of such an additive to be contained in the electrode material, in total, in order to achieve the desired prevention effects of the peeling.

Also, the material for the electrode 75, 77 (75–77) according to the present invention is preferably selected by considering the forming processes for the piezoelectric/electrostrictive layer 73 (71, 72), and more specifically, for example, it is preferable for the lower electrode 77, which has been formed on the substrate 44, to employ a refractory metal such as platinum that is unchangeable at high processing temperature for thermal processing of the piezoelectric/electrostrictive layer 73 during the thermal processing of the piezoelectric/electrostrictive layer 73. Also, in the case of the multi-layer piezoelectric/electrostrictive film device 20 shown in FIGS. 4 to 8, the bottom electrode 77 layered at the bottom and the intermediate electrode 76 layered between the piezoelectric/electrostrictive layers 71 and 72, which have been formed before the thermal processing, are preferably formed by employing refractory metals such as platinum.

On the contrary, in the case of the piezoelectric/electrostrictive film device 10 shown in FIG. 1 or so on, the upper electrode 75, that is formed after the thermal processing of the piezoelectric/electrostrictive layer 73, (in the case of the piezoelectric/electrostrictive film device 20 shown in FIGS. 4 to 8, the electrode 75 layered at the top) may preferably be formed by employing metals having lower melting temperature such as aluminum, gold or silver, because the electrode can be formed at lower temperature. In addition, suitable methods for forming the electrodes include, for example, ion beam, sputtering, vacuum evaporation, PVD, ion plating, CVD, plating, screen process printing, spraying and dipping an the like.

The piezoelectric/electrostrictive film layer 73 according to the present invention comprises a protruded portion 79 that is provided extending widely between the lower electrode 77 and the upper electrode 75 to cover the upper surface of the lower electrode 77 and the lower surface of the upper electrode 75 without contacting the upper surface of the lower electrode and the lower surface of the upper electrode, and the protruded portion 79 is, at least, coupled to the substrate 44 via a coupling member 70 comprising a specific material which maintains substantially the same flexural displacement as and a resonant frequency that is at least 3% larger than, that of an identical piezoelectric/electrostrictive film device without a coupling member.

Also, the piezoelectric/electrostrictive layer 71, 72 of the multi-layer piezoelectric/electrostrictive film device 20 according to the present invention as shown in FIG. 4 or the like comprise a protruded portion 79 that is provided extending widely between each of a plurality of electrodes 75–77 to cover the upper surfaces and the lower surfaces of the electrodes 75–77, wherein the lower surface or the upper surface of the piezoelectric/electrostrictive layer 71, 72 does not contact the lower surface or the upper surface of each of the electrodes 75–77, and the protruded portion 79 is, at least, coupled to the substrate 44 via a coupling member 70 comprising the specific material described above.

This ensures insulation of the each of electrodes 75, 77 (75–77) to provide the piezoelectric/electrostrictive film device 10 (20) which is free in dielectric breakdown and short circuit. Further, since the coupling member 70, which couples the substrate 44 and the protruded portion 79, is of a material such as organic-inorganic hybridized material, that has a desirable penetration depth of Microvickers hardness indenter and that maintains substantially the same flexural displacement as, and a resonant frequency that is at least 3% larger than that of an identical piezoelectric/electrostrictive film device without a coupling member, peeling off at interfaces among the substrate 44, the electrodes 75, 77 (75–77) and the piezoelectric/electrostrictive layer 73 (71, 72) can be prevented. Further, the piezoelectric/electrostrictive film device is capable of achieving more rapid response while maintaining flexural displacement equal to that of conventional devices. Additionally, since the gap formed between the protruded portion 79 of the piezoelectric/electrostrictive layer 73 (71, 72) and the substrate 44 is filled with the coupling member 70, consequently, the piezoelectric/electrostrictive characteristics between each device can be made almost homogenous even though the fluctuation in the sizes and shapes of the protruded portion 79, and those of the gaps exists more or less among the individual devices.

In addition, although the reason why the piezoelectric/electrostrictive film device 10 (20) of the present invention promotes the above-indicated advantageous effects is not clear, it would be considered because the piezoelectric/electrostrictive layer 73 (71, 72) is least engaged in the latitudinal direction and strained with a tensile stress in a longitudinal or elongated direction (the direction being normal to the thickness direction). Further, although the protruded portion 79 of the piezoelectric/electrostrictive layer 73 (71, 72) may be used "in a manner of being incompletely coupled," as described in JP-A-6-260694, it is preferable that the coupling between the protruded portion of the piezoelectric/electrostrictive layer is coupled to the substrate 44 only via coupling member 70.

In the present invention, it is preferable to layer at least the coupling member 70 in the lower part of the protruded portion 79 of the piezoelectric/electrostrictive layer 73 as shown in FIGS. 1 to 6, to provide larger resonant frequency in a effective way for one formed by coupling the lower part of the protruded portion 79 and the substrate 44, and to ensure the mechanical strength of the coupling member 70. In this case, although the coupling member 70 may couple a part of the lower surface of the protruded portion 79 of the piezoelectric/electrostrictive layer 73 to the substrate 44, the coupling member preferably couples the entire lower surface of the protruded portion 79 of the piezoelectric/electrostrictive layer 73 to the substrate 44, in view of achieving higher resonant frequency as well as improving weatherability of the device (moisture resistance, light resistance, acid resistance and stain resistance). Further, the coupling member 70 preferably covers at least a part of the lower surface and the upper surface of the protruded portion 79 of the piezoelectric/electrostrictive layer 73 to couple at least the part of the lower surface and the upper surface of the protruded portion 79 to the substrate 44 as shown in FIGS. 7, 10, 16 and 19 in view of enhancing the tensile stress in the longitudinal direction (the direction being normal to the thickness direction) to obtain higher resonant frequency, as well as improving the weatherability of the device (moisture resistance, light resistance, acid resistance and stain resistance).

Figure 11:
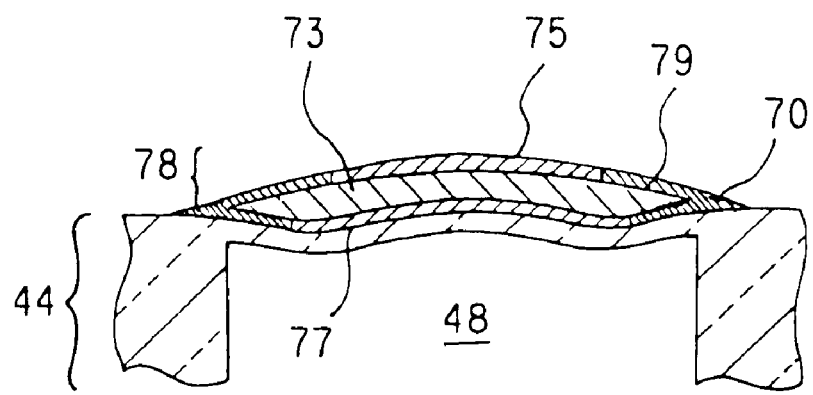
FIG. 11 is a partially cross-sectional view showing yet another embodiment of the present invention.
Figure 13:
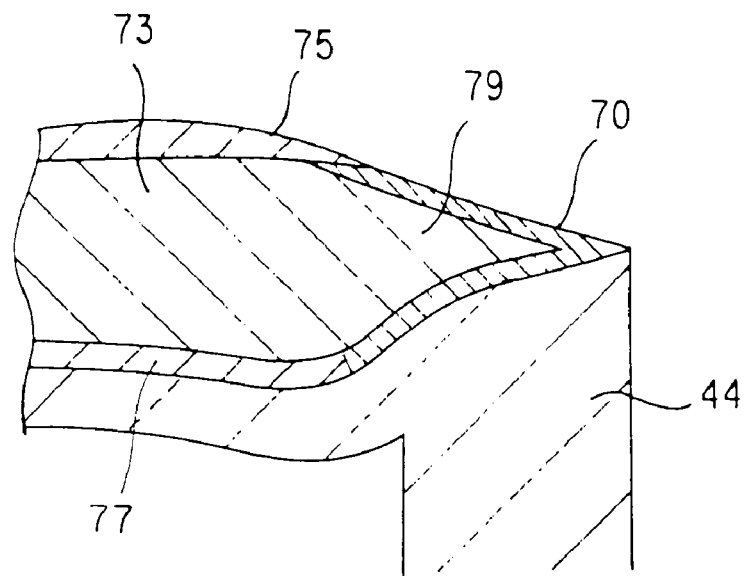
FIG. 13 is a partially enlarged view of the piezoelectric/electrostrictive film device that is shown in FIG. 11.
Figure 14:
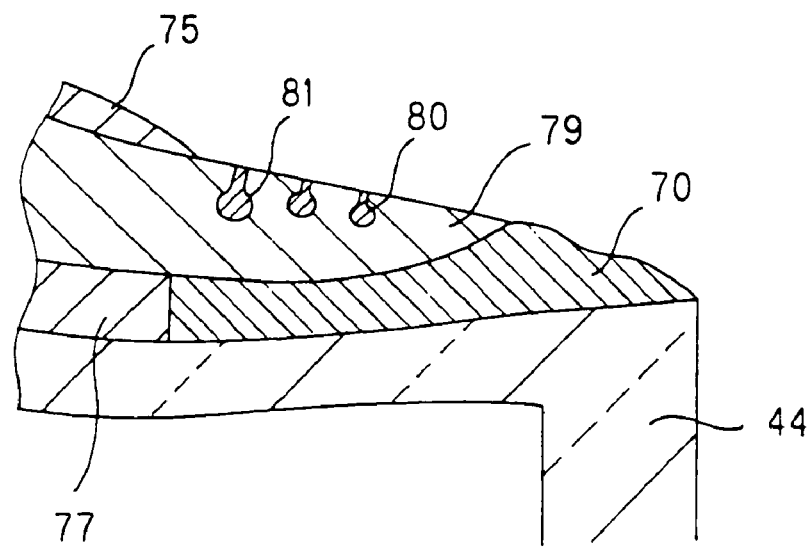
FIG. 14 is a partially enlarged view of the piezoelectric/electrostrictive film device that is shown in FIG. 1.
Figure 15:
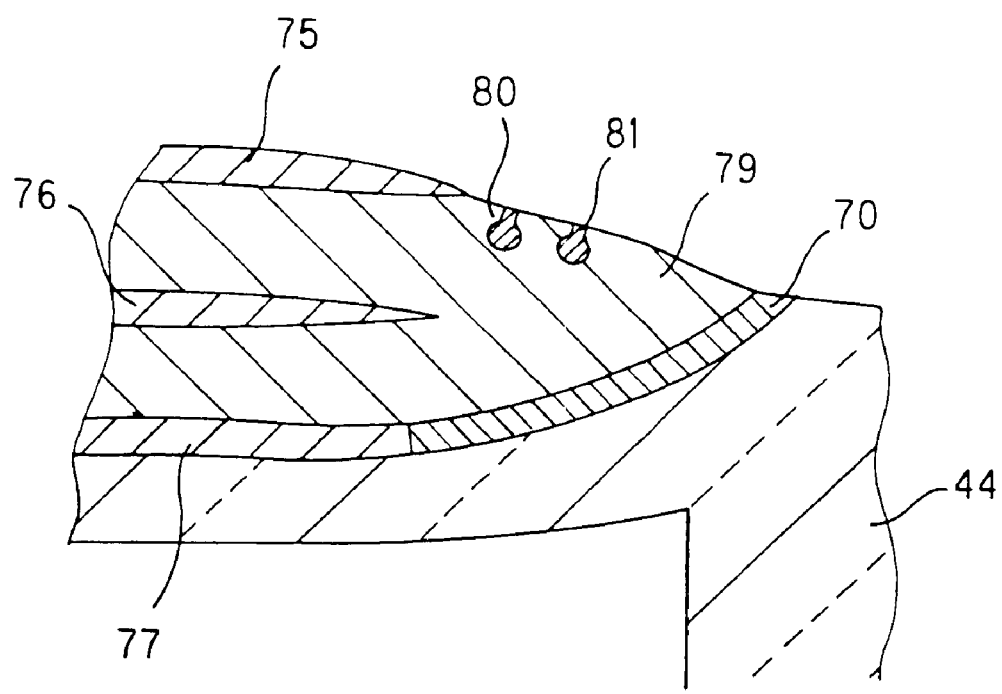
FIG. 15 is a partially enlarged view of the piezoelectric/electrostrictive film device that is shown in FIG. 4.
Figure 20:
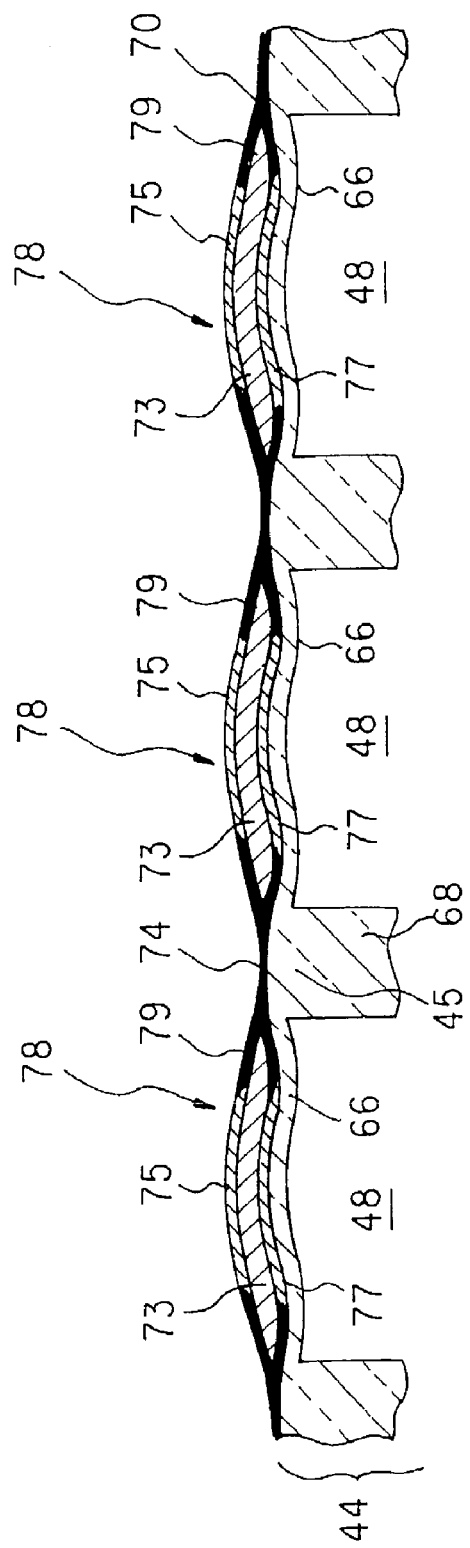
FIG. 20 is a partially cross-sectional view showing yet another embodiment of the present invention.

In view of inhibiting the deterioration of the insulation distance and durability in addition to the aforementioned view, it is preferable to fill pores 80 opening on the upper surface of the protruded portion 79 with a material 81 which is same as the material for the coupling member 70, while coupling the lower surface of the protruded portion 79 of the piezoelectric/electrostrictive layer 73 to the substrate 44, as shown in FIGS. 14, 15 (pores are generated because of inhomogeneity in the piezoelectric/electrostrictive material and uneven temperature and the like during the thermal processing, and it is not easy to completely remove them, and thus they adversely affect the device by decreasing the insulation distance or decreasing the durability due to becoming the admission ports of moisture and contaminants.), it is particularly preferable to provide the coupling member 70 covering at least the protruded portion 79 of the piezoelectric/electrostrictive layer 73 to couple at least entire protruded portion 79 of the piezoelectric/electrostrictive film device 73 to the substrate 44, as shown in FIGS. 11, 13 and 20.

Further, it is preferable for the coupling member 70 shown in FIGS. 7, 8, 10, 11 and so on to have the outer surface being gently sloped toward the substrate 44, in view of effectively enhancing mechanical strength of the coupling member 70. Also, the coupling member 70 preferably has thickness distribution that gradually increases from the starting point where the coupling member is provided toward the edge point and eventually reaches the maximum thickness at the edge of the protruded portion, in view of effectively enhancing the tensile stress in the longitudinal direction (the direction being normal to the thickness direction) of the piezoelectric/electrostrictive layer.

As shown in FIGS. 10, 11, 19, 20 and so on, the coupling member 70 according to the present invention is not necessary to be provided covering the contact surfaces with the electrodes such as the upper electrode 75 of the piezoelectric/electrostrictive layer 73 or the upper electrode 75 itself (for the multi-layer piezoelectric/electrostrictive film device 20 shown in FIGS. 4 to 6, the uppermost electrode 75).

Figure 9:
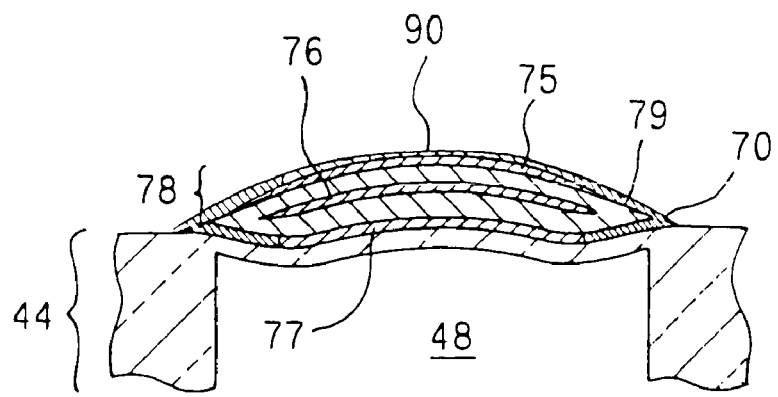
FIG. 9 is a partially cross-sectional view showing yet another embodiment for the multi-layer piezoelectric/electrostrictive film device of the present invention.
Figure 10:
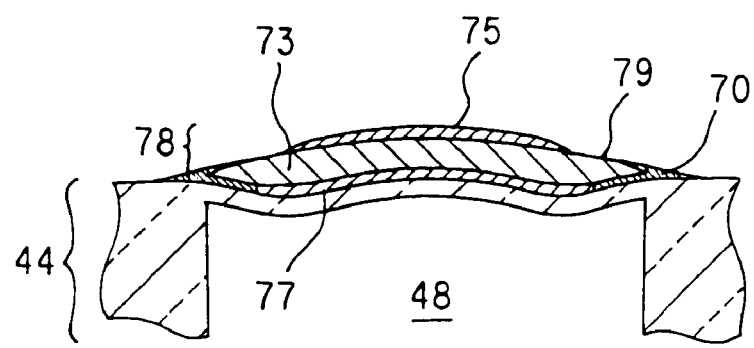
FIG. 10 is a partially cross-sectional view showing yet another embodiment of the present invention.
Figure 12:
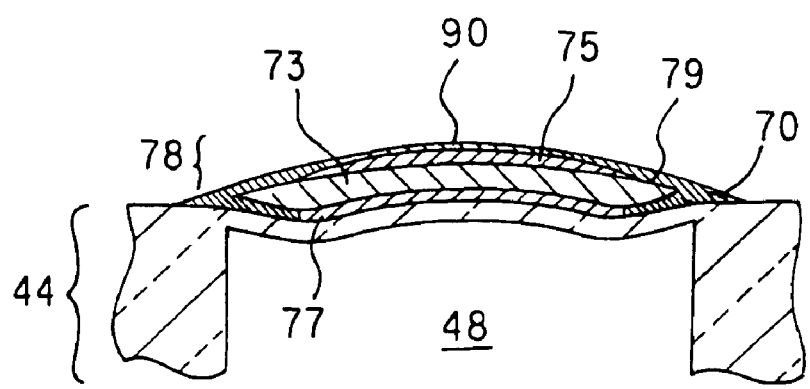
FIG. 12 is a partially cross-sectional view showing yet another embodiment of the present invention.
Figure 18:
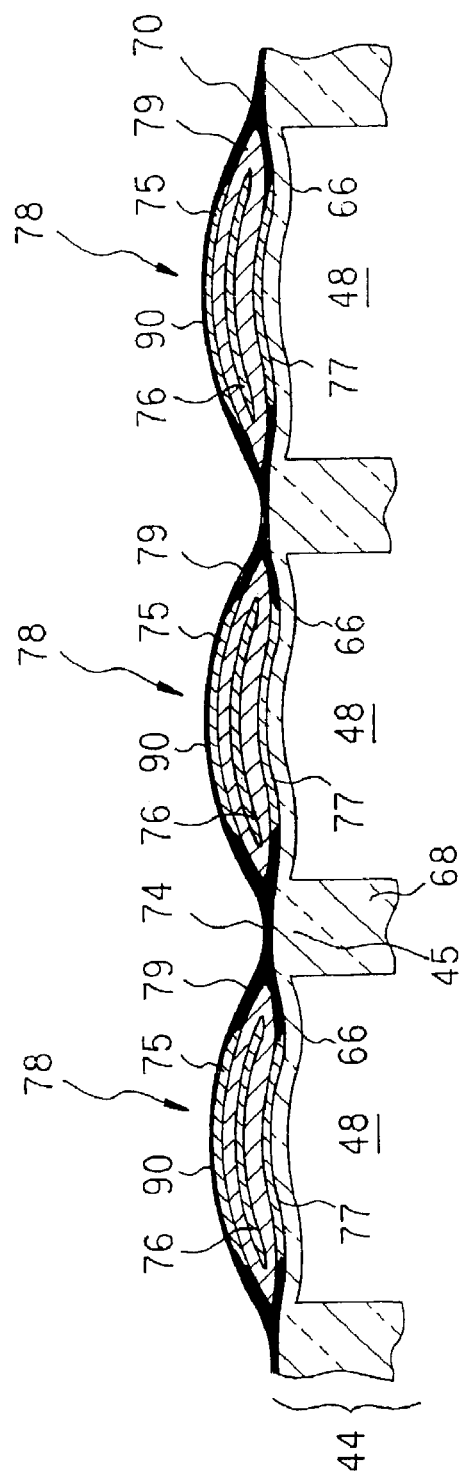
FIG. 18 is a partially cross-sectional view showing yet another embodiment of the present invention.
Figure 19:
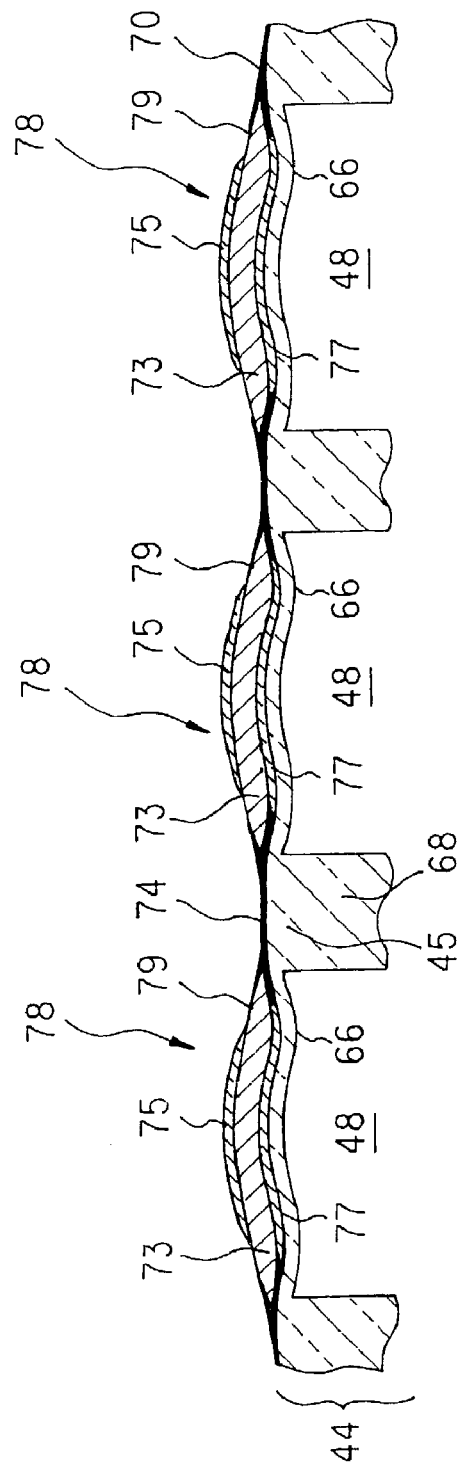
FIG. 19 is a partially cross-sectional view showing yet another embodiment of the present invention.
Figure 21:
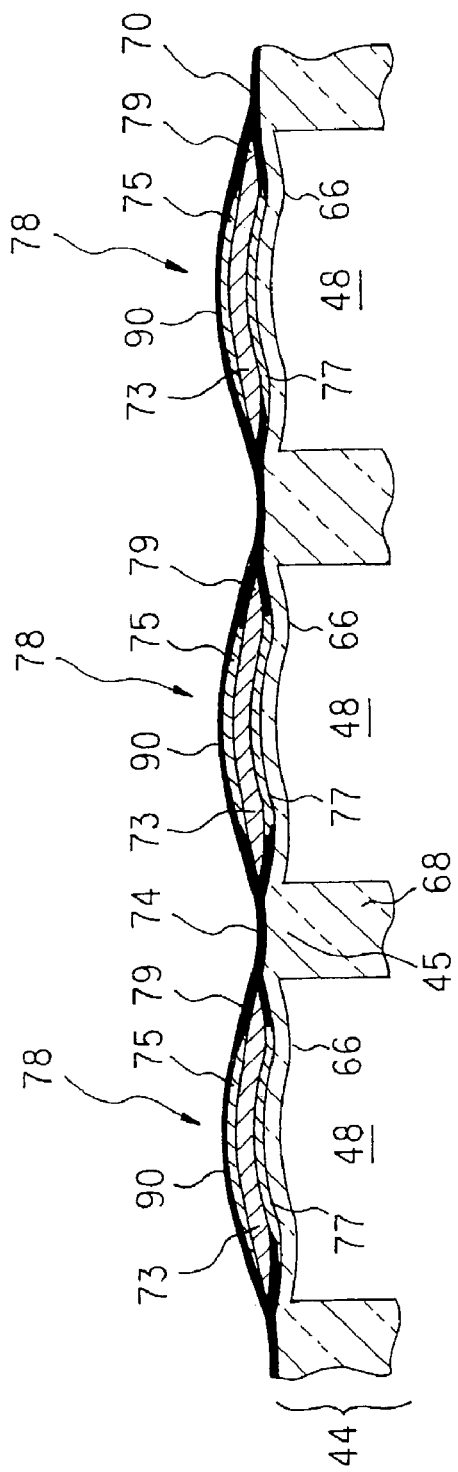
FIG. 21 is a partially cross-sectional view showing yet another embodiment of the present invention.

However, it may be preferable in the present invention to provide a loosely bound layer 90 of a material which is same as the material for the coupling member 70 having a thickness of $1/15$ or less, more preferably $1/30$ or less, of sum of the thickness of the thin portion 66 and the piezoelectric/electrostrictive actuator 78 to cover the contact surface with the electrode such as the upper electrode 75 of the piezoelectric/electrostrictive layer 73 (this arrangement is not shown) or to cover the upper electrode 75 as shown in FIGS. 12 and 21 (for the multi-layer piezoelectric/electrostrictive film device 20 shown in FIGS. 9 and 18, the uppermost electrode 75), in view of significantly enhancing the resonant frequency and the weatherability of the device without substantially decreasing the flexural displacement. The latter arrangement, wherein the loosely bound layer 90 is provided so as to cover the upper electrode 75, is preferable among them, in view of simplifying the process for manufacturing the device and making it flexibly applicable to accommodate variations in the shapes of the devices.

In addition, as shown in FIGS. 12 and 21, it is preferable for the loosely bound layer 90 to be formed integrally with the aforementioned coupling member 70, having the outer surface being gently sloped toward the substrate 44, and having thickness distribution that gradually increases from the starting point in which the coupling member is provided toward the edge point and eventually reaches the maximum thickness at the edge of the protruded portion 79, in view of effectively enhancing the tensile stress in the longitudinal direction (the direction being normal to the thickness direction) of the piezoelectric/electrostrictive layer 73.

As shown in FIGS. 16 to 21, it is preferable to couple at least two adjacent piezoelectric/electrostrictive actuators 78 with at least one coupling member 70 in the case where a plurality of piezoelectric/electrostrictive actuators 78 are provided on the substrate 44, in the present piezoelectric/electrostrictive film device.

When a piezoelectric/electrostrictive film device having a plurality of piezoelectric/electrostrictive actuators provided on the substrate is manufactured, such a device may be manufactured by coupling a predetermined number of the piezoelectric/electrostrictive film devices provided with only one piezoelectric/electrostrictive actuator thereon by joining or adhering their substrate portions each other. A piezoelectric/electrostrictive film device having a structure shown in any one of FIGS. 16 to 21 may be manufactured in a highly integrated form, compared with the piezoelectric/electrostrictive film device manufactured in the aforementioned manner. Moreover, the durability of the device may be improved since the probability in the occurrence of peeling off of the device from the end portion thereof will be reduced. This is because the end portion of a piezoelectric/electrostrictive actuator is integrally unified with the end portion of the adjacent piezoelectric/electrostrictive actuator since the end portions of them are coupled with the coupling member each other.

Figure 22:
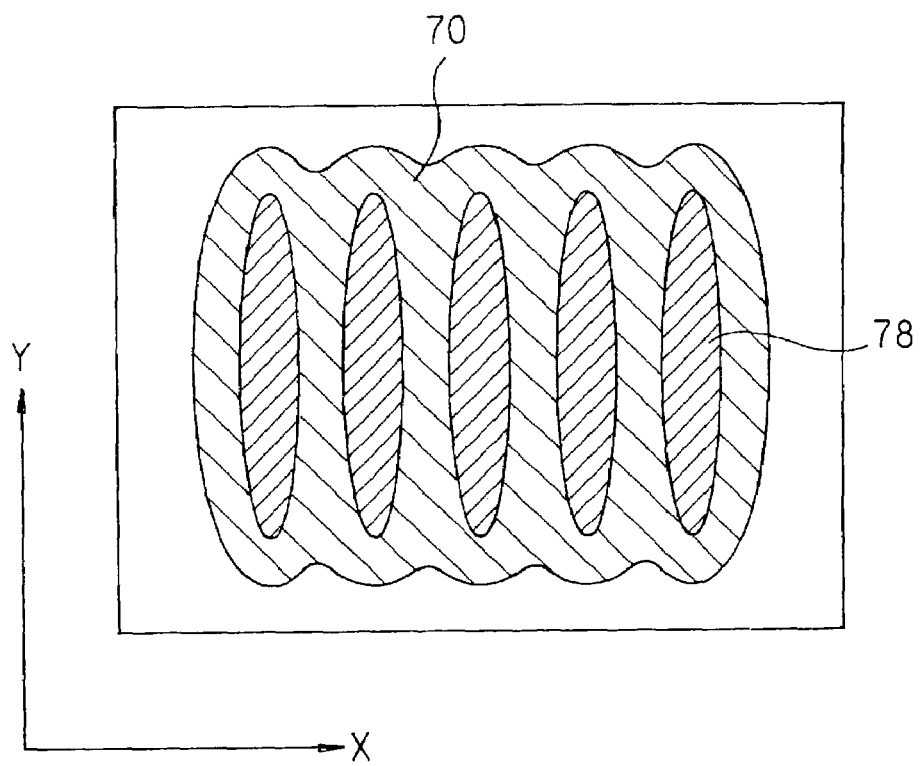
FIG. 22 is a partially cross-sectional view showing yet another embodiment of the present invention.
Figure 23:
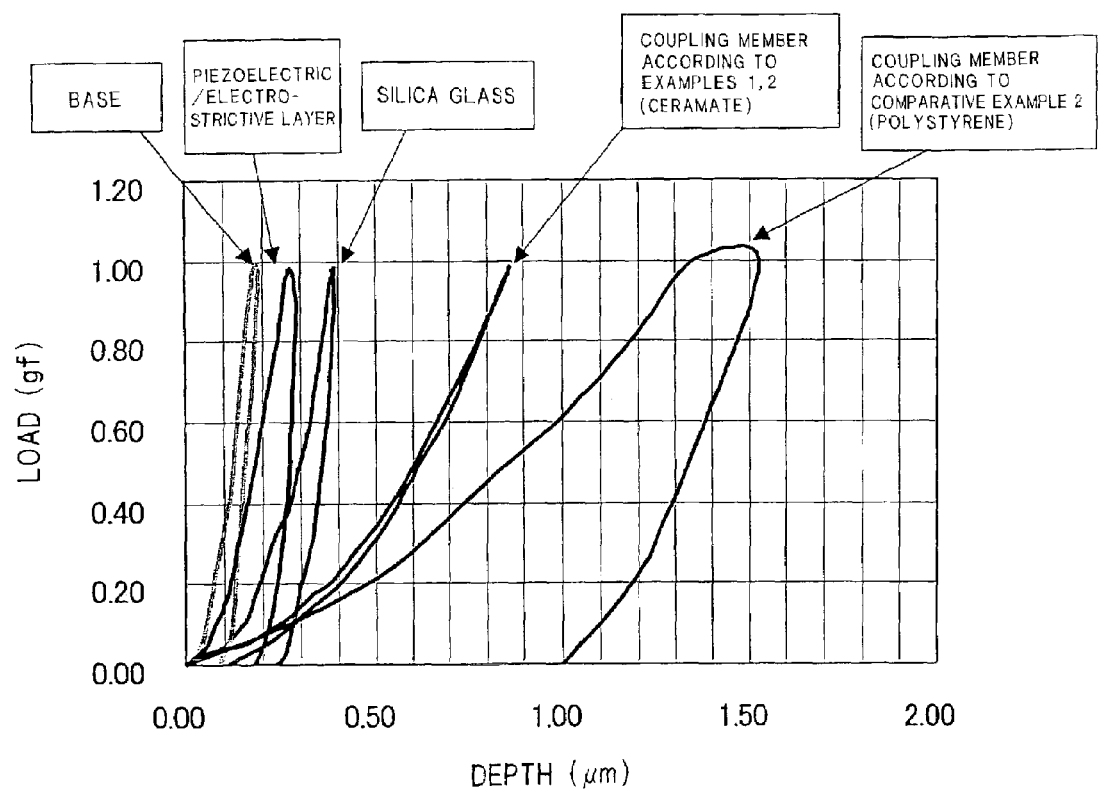
FIG. 23 is a graph showing results of penetration depth of Microvickers hardness indenter of piezoelectric/electrostrictive film devices of the respective embodiments and comparative embodiments.
Figure 24:
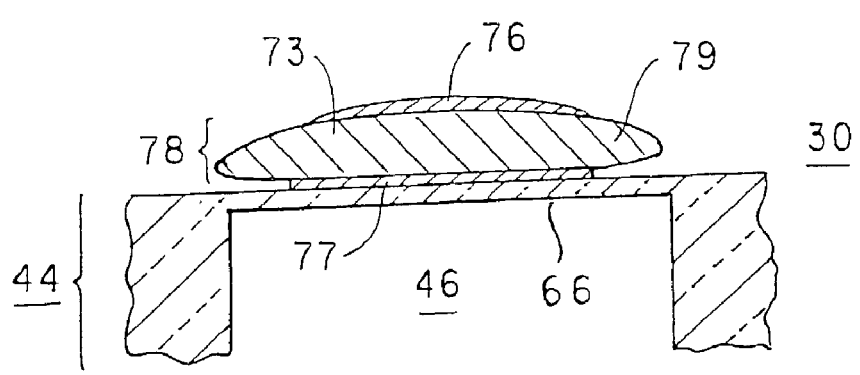
FIG. 24 is a partially cross-sectional view of the conventional piezoelectric/electrostrictive film device.

FIG. 22 shows a schematic plan view of the piezoelectric/electrostrictive film device being provided with a plurality of piezoelectric/electrostrictive actuators on the substrate. The constraining power of the device in the X and Y axes may be increased since piezoelectric/electrostrictive actuators constrain each other, like the manner shown in FIG. 22, being fixed in the X-Y planes, when the piezoelectric/electrostrictive actuators are coupled with the coupling member, as shown in FIG. 22. Thus, the resonant frequency of the device may be increased to a great extent.

Furthermore, when a plurality of piezoelectric/electrostrictive actuators 78 is disposed on the substrate at a predetermined interval, as shown in FIGS. 16 to 22, it is preferable that the coupling member 70 coupled the piezoelectric/electrostrictive actuators 78 includes the portion 74 coated with the coupling member and formed on the upper surface of the substrate portion 45 located between the two adjacent piezoelectric/electrostrictive actuators. It is further preferable that the portion 74 of the coupling member is adhered firmly on the upper surface of the substrate portion 45. By employing this construction, the resonant frequency of the device may be further increased and the prolonged durability may be attained.

It is preferred to form the portion 74 of the coupling member on the fixing portion 68 of the upper surface of the substrate, that is, make the substrate portion 45 present in the fixing portion 68 of the substrate. The resonant frequency of the device may be further improved while keeping the occurrence of the cross talk at a reduced level by employing a coupling member having a Young's modulus lower than that of the substrate, for the coupling of piezoelectric/electrostrictive actuators. FIGS. 16, 17, 18, 19, 20, and 21 are showings corresponding to the piezoelectric/electrostrictive actuators shown in FIGS. 7, 8, 9, 10, 11, and 12, and thus they show the devices being provided with a plurality of piezoelectric/electrostrictive actuators, respectively.

The coupling member 70 according to the present invention preferably comprises a material, having a penetration depth of a Microvickers hardness indenter that is larger than that of the piezoelectric/electrostrictive layer 73 and lower than 1.3 μm. This provides increasing the stiffness of the piezoelectric/electrostrictive layer 73 without decreasing the flexural displacement of the thin portion 66 and the piezoelectric/electrostrictive layer 73 so that larger flexural displacement is maintained while enhancing the resonant frequency. More preferably, the coupling member comprises a material having a penetration depth that is larger than that of the piezoelectric/electrostrictive layer by 20% or more and below 1.2 μm. Most preferably, the coupling member comprises a material having a penetration depth that is larger than that of the piezoelectric/electrostrictive layer by 50% or more and below 1.0 μm.

Further, the coupling member 70 of the present invention is preferably composed of a material having a Young's modulus less than that of the piezoelectric/electrostrictive layer and larger than 2.4 GPa. More preferably, the coupling member is composed of a material having a Young's modulus of 20% or less than that of the piezoelectric/electrostrictive layer and larger than 2.8 GPa, and it is particularly preferred that the coupling member is composed of a material having a Young's modulus of 50% less than that of the piezoelectric/electrostrictive layer 73 and larger than 4.0 GPa.

Further, the coupling member 70 having the above-indicated penetration depth of a Microvickers hardness indenter may include an organic-inorganic hybridized material which contains an organic material and an inorganic material in a mixed manner at atomic, molecular or fine mixing levels, as a preferable material that is capable of achieving a higher resonant frequency while ensuring larger flexural displacement.

In addition, the organic-inorganic hybridized material may include a material which organic silicon compound having general formula of $R_nSi(OR')_{4-n}$ (where R and R' is identical or different organic group, and n is an integer number of 1–3) is hydrogen-bonded to fine particles of an inorganic compound as described in WO97/49775 pamphlet (hereinafter called "first organic-inorganic hybridized material"), or a material including particles of an inorganic compound contained in a matrix including fluorine-substituted alkyl-containing silicone resin components as described in JP-A-2002-79616 (hereinafter called "second organic-inorganic hybridized material"), in view of capable of providing aforementioned desirable effects and a function of coating material with higher water repellency to the coupling member.

For the first organic-inorganic hybridized material, the organic silane compound may be preferably an organic compound having a structure having —Si—O— unit as the framework structure and additionally containing organic functional group, more preferably a tri-functional alkoxysilane having general formula of $RSi(OR')_3$, and preferably transition metal-containing organic silicon compound that includes transition metal. In the above general formula, R may include, for example, alkyl group such as methyl group, ethyl group and propyl group, and allyl group such as phenyl group, R' includes, for example, alkyl group such as methyl group, ethyl group, propyl group and butyl group, allyl group such as phenyl group, and substitution alkyl group such as acetyl group and β-methoxy group.

Also, the inorganic compound particles may preferably be particles of oxides of one, two or more elements selected from the group consisting of, for example, Ti, Zr, V, V, Nb, Cr, Mo, W, Al, Mn, Fe, Co, Ni, and Si.

On the contrary, the second organic-inorganic hybridized material is preferably porous inorganic compound particles, and more preferably has an outer shell, inside of which is porous or hollow. Further, the inorganic compound particles preferably have a particle size of 5–300 nm, and preferably contain silica as the main component. To make sure, descriptions and disclosures concerning the organic-inorganic hybridized material in WO97/49775 and JP-A-2002-79616 are incorporated herein by reference.

The coupling member 70 and/or the loosely bound layer 90 shown in FIGS. 9, 12, 18, 21 preferably further contain a coloring agent.

The inspection for the formation of the coupling member 70 or the loosely bound layer 90 may be done in a simple manner with a high accuracy by adding a coloring agent in the material for the coupling member 70 and/or the loosely bound layer 90, without carrying out complicated operations, when one employs a microscopic examination on a cross section of a sliced piece of the device sample, or by measuring the thickness of the coupled portions at the several points with a spectroscopic reflectometry type film thickness measuring system.

Here, the term "coloring agent" in the present invention includes not only a colored coloring agent which can be recognized with naked-eye observation, but also a colorless one which can be recognized only with optical analytical apparatuses wherein X ray, ultraviolet ray or the like other than a visible light is used for the identification. Indeed, the term coloring agent includes a luminescent substance such as fluorescent substance, phosphorescent substance or the like which emits a light or a ray when irradiated with an energy derived from heat, X-ray, sonar, radial ray, chemical reaction and the like.

Various kinds of inorganic and organic coloring agents which can be identified with the naked eye are preferably used as a coloring agent to be incorporated into the coupling member and the like in the present invention since those coloring agents do not require the use of the optical analytical apparatus for the identification.

Luminescent substances such as fluorescent substance, phosphorescent substance or the like are preferably used since they have a wide range of applicability while they require the use of the optical analyzers.

That is, sometimes the identification of the presence of the coloring agent is difficult in the case that the piezoelectric/electrostrictive layer 73 (71, 72) of the piezoelectric/electrostrictive device 10 (20) is colored, and additionally the coupling member is very tiny. However, if a luminescent substance such as fluorescent substance, phosphorescent substance or the like is contained in the coupling member, even the formation of a tiny coupling member can be easily identified because of the high sensitivity, irrespective of the coloring of the piezoelectric/electrostrictive layer 73 (71, 72). Furthermore, one may easily and accurately control the thickness of the coupling member 70 applied thereto and that of the loosely bound layer 90 since the qualitative determination of the content of the luminescent substance can be done by measuring the intensity of the luminescence or the like.

The luminescent pigment in the present invention includes luminescent pigments luminescencing with X-ray, luminescent pigments luminescencing with infrared-ray, luminescent pigments luminescencing with radial ray, luminescent pigments luminescencing with heat, luminescent pigments luminescencing with visible light, luminescent pigments luminescencing with a chemical, bioluminescent pigments, or the like, depending upon the luminescence mechanism. And, the luminescent pigment in the present invention includes fluorescent pigments, phosphorescent pigments, depending upon the kind of the light emitted.

The luminescent pigment such as a luminescent pigment luminescencing with ray such as ultraviolet ray, infrared ray, visible light or the like are preferable among the aforementioned pigments in the present invention, in view of the stability and the sensitivity.

Furthermore, the coloring agents which can be removed or decomposed by a physical means such as thermal processing at an elevated temperature of 400 to 800° C. irrespective of the colored coloring agents recognized with naked eye or the luminescent pigments which emit a ray when absorbed an energy, are preferable in the present invention.

The removal of the coloring agent after the completion of the inspection of the coupling member 70 is preferable. This is because the characteristics of the coupling member 70 and/or those of the loosely bound layer 90, and the characteristics of piezoelectric/electrostrictive layers 73 (71, 72) and/or those of the electrodes 75,77 (75 to 77) would be adversely effected by the coloring agent itself and/or the interaction between the coloring agent and the material(s) for forming the piezoelectric/electrostrictive layers 73 (71, 72) and/or that (those) for the electrodes 75,77 (75 to 77). Thus, it is preferable to use a decomposable or removable coloring agent for the inspection purpose since such a coloring agent would not be present for any longer, if removed or decomposed in a proper manner as mentioned above.

The colored coloring agents usable in the present invention include, any one of the pigments and dyes selected from the group consisting of water soluble azoic pigments such as Lake red C, Watching red, or the like; water-insoluble azoic pigments such as monoazo yellow, disazo yellow or the like; condensed polycyclic pigments such as metal free-phthalocyanine pigments, anthraquinone pigments, isoindolinone pigments, quinacridone pigments or the like, azoic dyes, anthoraquinone dyes, indigoid dyes, sulfur dyes, triphenylmethane dyes, pyrazolone dyes, stilbene dyes, diphenylmethane dyes, xanthene dyes, alizarine dyes, acridine dyes, quinoneimine dyes, thiazole dyes, methine dyes, nitro dyes, nitroso dyes or the like. They may be used in combination, in case of need.

One may use any of them as far as it does not affect adversely on the coupling member, however, it is preferable to choose, depending upon the kind of the material(s) for forming the piezoelectric/electrostrictive layers 73 (71, 72) and/or that (those) for the electrodes 75,77 (75 to 77), a dye or a pigment which does not contain a metal in the molecule, or which does not form any compound deleterious to the coupling member during the removal treatment or decomposition treatment. One may choose preferably a pigment or dye having a particle size of 10 µm or less, more preferably the one having particle size of 5 µm or less, when the easiness of handling inclusive of the treatment for removal or decomposition is taken into consideration.

One may cite fluorescein, eosine, rhodamines or the like as a luminescent pigment which emits fluorescence when exposed to a visible light, near ultraviolet ray, ultraviolet ray, and the like. Fluorescein is preferable since it can be easily identified due to its strong intensity even in a trace amount. Eosine is also preferable since this compound is a derivative of fluorescein. Those luminescent pigments may be used preferably since it can be removed easily by exposing it to thermal processing inclusive of laser radiation and it does not contain a metal in the molecule. The conditions for removing the coloring agent by thermal processing would vary, depending upon the kind of the coloring agent, however, one may easily choose proper conditions by carrying out a small scale test using the coloring agent in question.

The coloring agent may be used in the form of a suspension or solution after suspending or dissolving it in a medium such as solvent therefor, vehicle therefor or the like. It is preferable to choose a solvent or vehicle having a high affinity to the coloring agent to be used. This is because the uniform distribution on and/or in the coupling member and/or the loosely bound layer may be expected in the case of a solution or suspension having an improved solubility or suspendability. An alcohol such as isopropyl alcohol may be usable for any coloring agent, irrespective of either hydrophilic property or hydrophobic property of the coloring agent, and especially preferable for the pigment. One may use a dispersant or a surfactant for the improvement of the dispersibility or solubility.

The method for forming the coupling member 70 includes, for example, applying a coating liquid to the piezoelectric/electrostrictive layer 73 via a coating process such as dipping, spraying, spin coating and so on, wherein the coating liquid may contain the inorganic compound particles described in WO97/49775 and hydrolytic compound of organic silicon compound having a general formula of $R_nSi(OR')4_n$ (R and R' are the same or different numbers, and n is an integer of 1–3) into an organic solvent such as alcohols including ethanol, propanol, butanol or isopropyl alcohol or ketones such as acetone or methylethyl ketone; or the coating liquid may contain the inorganic compound particles and a silicone compound having fluorine-containing alkyl group into a polarized solvent such as water, methanol, ethanol, propanol, isopropyl alcohol, butanol or acetone. Generally, the masking is done on the portion where no coupling member coated. Thus, the masking is not done on the portion to be coated with the coating liquid for forming the coupling member when a plurality of piezoelectric/electrostrictive actuators is coupled with the coupling member. The coupling member may be formed by coating the coating liquid with adjusting the rotating number of spin coating apparatus when the coupling member is formed by spin coating method.

When the coloring agent is incorporated into the coupling member 70 and/or the loosely bound layer 90, a solution or a suspension containing a coloring agent is admixed with a coating liquid prepared for formation of the coupling member and/or the loosely bound layer in an appropriate amount, taking into consideration the kind of the coloring agent and its property, especially intensity of emission of the ray. In the case of the luminescent pigment, one may admix a solution or suspension containing coloring agent with the coating liquid so that it is contained in the resultant in an amount of 0.0001 to 0.010 mass % in terms of solid material. In the case of the colored coloring agent, one may admix a solution or suspension containing the colored coloring agent with the coating liquid so that it is contained in the resultant in an amount of 0.0002 to 0.050 mass % in terms of solid material.

It is advisable to choose a proper medium for preparation of solution or suspension of a colored coloring agent or pigment, taking into consideration the miscibility with the coating liquid prepared for formation of the coupling member and/or the loosely bound layer. For example, if a coating liquid is an aqueous one, it is preferable to choose a water-based medium for preparation of solution or suspension of a colored coloring agent or pigment; and, if a coating liquid is an organic medium based one, it is preferable to choose an organic medium for preparation of solution or suspension of a colored coloring agent or pigment. However, as far as the coating liquid and the solution or suspension of a coloring agent are miscible with each other, any type of the medium can be used for the preparation of the solution or suspension of a coloring agent. That is, one may use an alcoholic solution or suspension of a coloring agent, which is miscible with either a hydrophilic coating liquid or a hydrophobic coating liquid. If the coloring agent is not soluble or dispersible in a medium, one may use finely pulverized particles of a coloring agent, and suspend them in the medium for admixing with the coating liquid. Further, one may use a dispersant, surfactant, or the like in such a case to make the particles uniformly dispersed or suspended in the suspension.

There is a commercially available fluorescent pigment containing organic liquid distributed under the trade name of Neoglow water-washable fluorescent pigment penetrative liquid F-4A-C as a solution prepared by dissolving in an organic medium a light-emissive fluorescent pigment being removable by thermal processing at an elevated temperature.

It may be preferable to employ the coating liquid having a solution viscosity of not larger than 1000 cP, in view of the coupling member which couples at least the entire lower surface 79 of the piezoelectric/electrostrictive layer 73 and the substrate 44 without significant drying shrinkage, and more preferably employ the coating liquid having a solution viscosity of not larger than 300 cP, and most preferably employ the coating liquid having a solution viscosity of not larger than 50 cP.

In addition, in the case of filling the pores opened on the contacting surface of the piezoelectric/electrostrictive layer 73 that contacts the upper electrode 75 with the material identical to the coupling member 70, or in the case of providing the loosely bound layer 90 having a predetermined thickness so as to cover the contacting surface of the piezoelectric/electrostrictive layer 73 contacting the upper electrode 75 or the upper electrode 75 itself (in the case of the multi layer piezoelectric/electrostrictive film device 20, the uppermost electrode 75), the above-mentioned coating liquid may be applied to the entire piezoelectric/electrostrictive layer 73 and/or the upper electrode 75 (uppermost electrode 75). In this case, for the purpose of providing the loosely bound layer 90 having a thickness of $1/15$, more preferably $1/30$, of the sum of the thickness of the thin portion 66 and the piezoelectric/electrostrictive actuator 78, spin coating is preferably performed immediately after dropping the coating liquid at the rotation rate of not less than 1500 rpm. Further, in the case of filling only the opening pores 80, after the above-mentioned spin coating processing, the spin coating may be performed immediately after dropping the coating liquid at the rotation rate of not less than 2500 rpm, or a process of blowing compressed air or wiping the surface of the contacting layer may be performed. In the case of applying the above-mentioned coating liquid to the entire piezoelectric/electrostrictive layer via dipping or spraying, although the loosely bound layer 90 can be provided by blowing compressed air, the layer is preferably formed via spin coating, in view of readily forming a thin and uniform layer.

In the present invention, after applying the above-mentioned coating liquid and leaving it at the room temperature for more than 10 minutes to remove most of the solvent, heat drying is preferably carried out by increasing the atmospheric temperature to a predetermined temperature at a rate of not greater than 600° C./Hr.

If heat drying is carried out immediately after applying, or if drying is rapidly carried out, the solvent in the coating liquid may rapidly evaporate to rapidly shrink the coating liquid, thereby causing the cracks in the coupling member, or causing the peeling in the interface with the piezoelectric/electrostrictive layer.

Further, heat drying is preferably carried out at 60–120° C., and more preferably at 100–120° C. If drying is carried out at a temperature of higher than 120° C., the solvent in the coating liquid may rapidly evaporate to rapidly shrink the coating liquid, for the same reason as mentioned in the case of leaving at the room temperature, thereby causing the cracks in the coupling member, or causing the peeling in the interface with the piezoelectric/electrostrictive layer. On the contrary, drying at a temperature lower than the above-mentioned heating temperature promotes insufficient removing of water remained therein as well as the organic solvent.

In the present invention, the curing process is preferably carried out by heating at a higher temperature, sequentially or in a different process, after the above-mentioned drying process, as required. More specifically, for the organic-inorganic hybridized material mentioned before for example, the coupling member is preferably heated to be cured at a temperature of not higher than 700° C., more preferably not higher than 600° C., much more preferably at a temperature lower than 500° C., and most preferably, at a temperature lower than 450° C.

If the temperature for the heat curing processing exceeds the above-mentioned temperature ranges, Si chemistry in the coupling member may react the material of the piezoelectric/electrostrictive layer to cause defects of the piezoelectric/electrostrictive layer as well as deterioration of the piezoelectric/electrostrictive layer, thereby causing dielectric breakdown or mechanical breakdown and so on. Also, this may cause deformation of organic components in the coupling member, thereby causing the cracks in the coupling member.

In the meantime, the mechanical properties such as the penetration depth of a Microvickers hardness indenter or the chemical properties such as water repellency, of the first organic-inorganic hybridized material can be optimized by adjusting the types, quantities or number of the functional groups or the component ratio of organic and inorganic materials, or by adjusting the heating temperature during the curing processing to vary bonding strength of Si—O—Si bond (higher temperature provides higher hardness). Similarly, the mechanical properties such as penetration depth of Microvickers hardness indenter or chemical properties such as water repellency of the second organic-inorganic hybridized material can be optimized by adjusting the types and the component ratio of organic and inorganic materials.

The materials of the piezoelectric/electrostrictive layer 73 (71, 72) shown in FIG. 1 and so on may be crystalline material or amorphous material as far as it is a material which is capable of causing electrical field-induced distortion such as piezoelectric or electrostrictive effects. Also, it may be any one of semiconductors, ceramics, ferroelectric materials or anti-ferroelectric materials, and may be suitably selected to be employed in accordance with applications.

Specific materials may include a ceramic containing any one of, or two or more of lead zirconate, lead titanate, lead zirconate titanate, lead magnesium niobate, lead nickel niobate, lead zinc niobate, lead manganese niobate, lead stibium stannate, lead manganese tungstate, lead cobalt niobate, barium titanate, bismuth sodium titanate, sodium potassium niobate or strontium bismuth tantalate. In particular, materials containing lead zirconate titanate (PZT type) as a major constituent and materials containing lead manganese niobate (PMN type) as a major constituent or materials containing bismuth sodium titanate as a major constituent are preferable, in view of providing higher electric/mechanical coupling coefficient and piezoelectric factor and providing lower reactivity with the ceramic substrate during the firing of the piezoelectric/electrostrictive layer to obtain products having unvarying composition.

Further, in addition to these ceramic materials, the material may include, as a minor constituent, any one of, or two or more of lanthanum, calcium, strontium, molybdenum, tungsten, barium, niobium, zinc, nickel, manganese, cerium, cadmium, chromium, cobalt, stibium, ferrum, yttrium, tantalum, lithium, bismuth or stannum. For example, advantages such as providing adjustability of anti-electric field or piezoelectric properties may be obtained by adding lanthanum or strontium to the major constituent of lead zirconate, lead titanate or lead magnesium niobate.

In the present invention, the thickness of piezoelectric/electrostrictive layer 73 shown in FIG. 1 and so on is preferably selected to be equivalent to the thickness of the substrate 44, in view of ensuring the mechanical properties of the device and the predetermined flexural displacement. More specifically, the ratio of the thickness of the thin portion 66 of the substrate 44 to the piezoelectric/electrostrictive layer (thin portion/(piezoelectric/electrostrictive layer)) is preferably 0.1–30, more preferably 0.3–10, and most preferably, 0.5–5.

When the ratio of the thickness of the substrate 44 to the piezoelectric/electrostrictive layer (substrate/piezoelectric/ electrostrictive layer) is within these ranges, the substrate 44 (thin portion 66) can easily follow the firing shrinkage of the piezoelectric/electrostrictive layer 73 during the forming of the piezoelectric/electrostrictive layer 73 by the heat processing after coating the piezoelectric/electrostrictive material on the substrate 44, thereby providing integration with the fine piezoelectric/electrostrictive layer 73 without causing any peeling off. Also, this can provide sufficient resistance to the vibration caused by the flexure of the piezoelectric/electrostrictive layer 73.

However, the thickness of the piezoelectric/electrostrictive layer 73 is preferably 5–100 μm, in view of achieving miniaturization of the device, more preferably 5–50 μm, and most preferably, 5–30 μm.

In addition, in the case of the multi-layer piezoelectric/ electrostrictive film device 20 shown in FIGS. 4 to 8, the thickness of one layer of the piezoelectric/electrostrictive layers 71, 72 is preferably as thin as not greater than 30 μm, in view of obtaining a higher aspect ratio by having thin film-like piezoelectric/electrostrictive layer. Further, it is preferable to form a plurality of the piezoelectric/electrostrictive layers 71, 72 from the bottom layer and setting the thickness to be gradually thinner as forming upper layers one by one. That is, for example, it is preferably formed such that the thickness $t_n$ of $n^{th}$ layer from the bottom of the piezoelectric/electrostrictive layer satisfies the equation: $t_n \leq t_{n-1} \times 0.95$. Since the quantity of the distortion of the piezoelectric/electrostrictive layer become larger as the thickness of the piezoelectric/electrostrictive layer is thinner at a constant driving voltage, the efficiency of flexure can be improved and the flexural displacement can be effectively appeared by distorting the piezoelectric/electrostrictive layer formed in the upper portion more significantly than the piezoelectric/electrostrictive layer formed in the lower portion.

The piezoelectric/electrostrictive layer 73 according to the present invention may be, for example, obtained by carrying out the thermal processing after layering the piezoelectric/electrostrictive material comprising the aforementioned ceramic material and so on the lower electrode 77 of the formed on the substrate 44 (in the case of the multi-layer piezoelectric/electrostrictive film device 20 shown in FIGS. 4 to 8, at each time of layering each of the piezoelectric/electrostrictive film device 71, 72, or after forming the whole of each of the piezoelectric/electrostrictive layer).

The piezoelectric/electrostrictive materials employed in the present invention can be, for example, produced by the mixing oxide method, coprecipitation method or alkoxide method.

Also, the methods for coating the piezoelectric/electrostrictive material includes various methods for forming thick films such as screen process printing, dipping, coating or electrophoresis, or various methods for forming thin films such as ion beam, sputtering, vacuum evaporation, ion plating, chemical vapor deposition (CVD) or plating, and among these, the methods for forming thick films such as screen process printing, dipping, coating or electrophoresis are preferable, in view of being capable of obtaining the piezoelectric/electrostrictive layer 73 having better piezoelectric/electrostrictive characteristics.

The aforementioned protruded portion 79 can be provided by printing or coating the piezoelectric/electrostrictive material over the wide range covering the upper and the lower surfaces of each of the electrodes. Also, in this case, the material for the substrate can be selected from the materials having lower reactivity with the piezoelectric/electrostrictive material such as zirconium oxide during the heat processing to provide the complete non-coupling state of the protruded portion 79 of the piezoelectric/electrostrictive layer with the substrate 44.

Also, in the case of the multi-layer piezoelectric/electrostrictive film device 20 shown in FIGS. 4 to 8, the piezoelectric/electrostrictive material can be layered alternately with each of plurality of electrodes 75,76 after forming the electrode 77 on the substrate 44, and eventually the electrode 75 can be layered.

In the present invention, the thermal processing carried out after forming the piezoelectric/electrostrictive material on the electrode 77 (in the case of the multi-layer piezoelectric/electrostrictive film device 20 shown in FIG. 4 and so on, carried our at each time of layering the piezoelectric/ electrostrictive material between the electrodes positioned in the bottom layer and the intermediate layer, or after layering the piezoelectric/electrostrictive material for all necessary layers) can be performed at a temperature of 1000–1400° C., and in these cases, it is preferable to perform them in the presence of an atmospheric controlling material having identical composition to the piezoelectric/electrostrictive material, for the purpose of preventing volatilization of each of components of the piezoelectric/electrostrictive material to provide the predetermined ceramic composition.

EXAMPLES

The present invention will be described below in detail by examples of piezoelectric film devices and the present invention should not be limited by the examples. In this case, evaluations for each of the examples and comparative examples were conducted as follows.

Method for Evaluation (1) Flexural Displacement

The quantity of the displacement of the piezoelectric film device obtained by the examples and the comparative examples, to which an electric field of 3 kV/mm was applied at room temperature, was measured by a laser Doppler vibrometer.

(2) Resonant Frequency

Measurements were carried out for the piezoelectric film device obtained by the examples and the comparative examples by employing a laser Doppler vibrometer and a FFT analyzer. More specifically, a swept sine waveform (wave form including a plurality of frequency components) generated by the FFT analyzer was applied to the device to drive it, the resultant vibration of the device was measured by the laser Doppler vibrometer, the output rate of the laser Doppler vibrometer was input to the FFT analyzer to conduct a frequency analysis, and the peak of the lowest level was provided as resonant frequency.

(3) Penetration Depth of Microvickers Hardness Indenter, and Young's Modulus

The penetration depths and Young's moduli of the coupling member, the piezoelectric/electrostrictive layer and the substrate of the piezoelectric film device obtained by the examples and the comparative examples were measured by using micro penetrometer indenter under the conditions shown below:

i) apparatus: SHIMADU dynamic ultra micro penetrometer DUH-201;
ii) indenter: diamond indenter having a diagonal angle of 136 degree;
iii) testing mode: loading-unloading testing (load increases at a constant rate, and after holding it for an period, load decreases at a constant rate);
iv) indentation load: 1 gf;
v) indentation rate: 0.145 gf/sec.;
vi) load holding time: 10 sec.; and
vii) miscellaneous: objects to be tested (electrode, piezoelectric/electrostrictive layer and substrate) are miniaturized, or when the Vickers indenter can not be penetrated in a suitable condition due to reasons such as being too small or having curved plane or bumpy plane, the measurement is carried out for another object to be tested of same material and having shape suitable for being penetrated by the Vickers indenter in a suitable condition.

Moreover, the Young's modulus was calculated according to the following equation (3), under the assumption that Poisson's ratio for all the materials is 0.3:

$$E = 4.0/\delta^2 \quad (3)$$

wherein E denotes Young's modulus (GPa), $\delta$ denotes indenter penetration depth measured using a Diamond Vickers indenter having a diagonal angle of 136 degree at a load of 1 gf with a penetration speed of 0.145 gf/sec.

Example 1

A lower electrode comprising platinum (dimension: 1.2×0.8 mm, thickness: 3 μm) was formed via screen printing on the substrate, both of the thin portion and the fixed portion of which comprise $ZrO_2$ stabilized with $Y_2O_3$ (dimension of the thin portion: 1.6×1.1 mm, thickness: 10 μm), and the resultant one was integrated with the substrate by thermal processing at 1300° C. for 2 hours.

Upon them, a piezoelectric material comprising $(Pb_{0.999}La_{0.001})(Mg_{1/3}Nb_{2/3})_{0.375}Ti_{0.375}Zr_{0.250}O_8$, in which a portion of Pb is substituted by 0.1% by mol La, (mean particle size: 0.49 μm, maximum particle size: 1.8 μm) was formed by employing screen printing to be layered within a wide range of 1.3×0.9 mm including the surface corresponding to the upper surface of the lower electrode, to a thickness of 20 μm.

Next, an atmospheric controlling material having identical composition to the piezoelectric material was also provided within the vessel together, and the substrate having an electrode thereon, on which piezoelectric material was layered, was thermally processed at 1275° C. for 2 hours. The thickness of the thermally processed piezoelectric layer was 13 μm. Next, an upper electrode comprising gold was formed on the piezoelectric layer via screen printing within a range of 1.2×0.8 mm at thickness of 0.5 μm, and thereafter, thermal processing was carried out at 600° C.

Next, the portion of resultant device opposite to the surface on which the piezoelectric/electrostrictive layer and the electrodes were formed, was fixed to a pedestal in a manner of being masked with an UV sheet, and an inorganic film coating liquid including $SiO_2$ as a major constituent (product name: Ceramate C-513, produced by CATALYSTS & CHEMICALS IND. CO. LTD., Viscosity (25° C.): not larger than 20 cP, pH (25° C.): 3–5, liquid specific gravity: 0.9–1.0 g/ml, solvent: isopropyl alcohol and water) was applied throughout the entire device by the spin coating. In this case, the pedestal rotated at 500 rpm during the initial phase, and immediately after dropping colloidal silica, the rotation speed was increased to 2000 rpm, and the rotation was continued for 30 seconds.

Eventually, after stopping the rotation, the device applied with the inorganic film coating liquid was left at room temperature for 30 minutes, and thereafter the temperature was increased at a rate of 200° C./h, and then held a constant temperature of 80–120° C. for 1 hour, and thereafter the temperature was further increased continuously up to 300° C., and a cure process was accomplished at that temperature for 60 minutes to cure the coupling member coupling the entire protruded portion of the piezoelectric/electrostrictive layer and the substrate and the loosely bound layer covering the upper electrode to produce the piezoelectric/electrostrictive film device.

Figure 16:
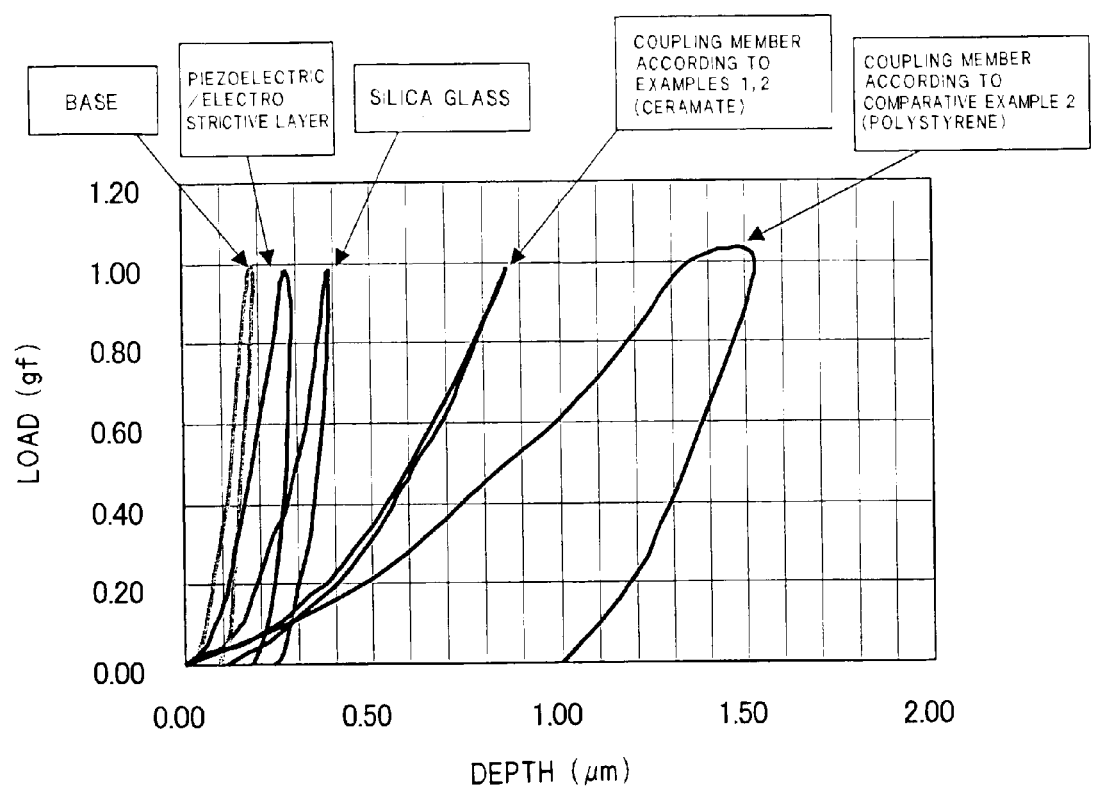
FIG. 16 is a partially cross-sectional view showing yet another embodiment of the present invention.
Figure 17:
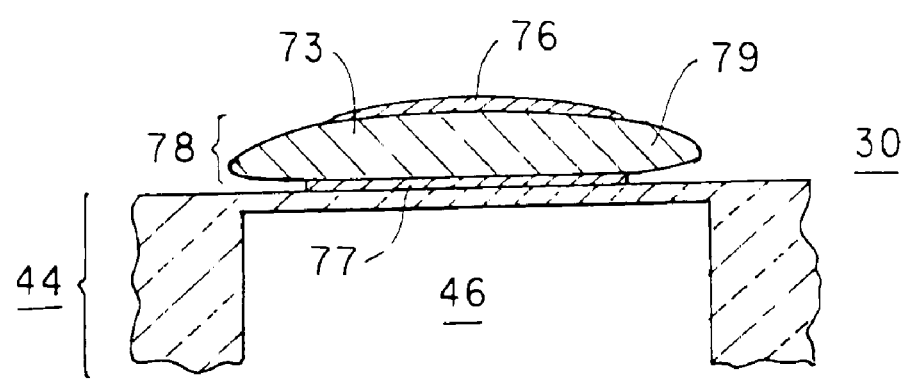
FIG. 17 is a partially cross-sectional view showing yet another embodiment of the present invention.

The penetration depths of the Microvickers hardness indenter for each of the components of the resultant piezoelectric/electrostrictive film device were, as shown in FIG. 16: 0.18 μm for the substrate; 0.27 μm for the piezoelectric/electrostrictive layer; and 0.87 μm for the coupling member and the loosely bound layer. Moreover, the Young's modulus of the substrate was 120 GPa, that of the piezoelectric/electrostrictive layer was 55 GPa, and those for the coupling member and the loosely bound layer were 53 GPa, respectively. In addition, the maximum thickness at the edge of the protruded portion of the piezoelectric/electrostrictive layer of the coupling member was 5 μm, and the thickness of the loosely bound layer was 0.5 μm.

Comparative Example 1

A piezoelectric/electrostrictive film device was manufactured as similar as in the Example 1 except that the predetermined inorganic film coating liquid was not applied, and that coupling member and loosely bound layer were not provided.

Penetration depths of Microvickers hardness indenter of each of the components of the resultant piezoelectric/electrostrictive film device were 0.18 μm for the substrate and 0.27 μm for the piezoelectric/electrostrictive layer. Young's modulus of the substrate was 120 GPa, and that of the piezoelectric/electrostrictive layer was 55 GPa.

Comparative Example 2

A piezoelectric/electrostrictive film device was manufactured as similar as in the Example 1 except that a coupling member and a loosely bound layer comprising polystyrene were provided.

The penetration depths of the Microvickers hardness indenter for each of the components of the resultant piezoelectric/electrostrictive film device were: 0.18 μm for the substrate; 0.27 μm for the piezoelectric/electrostrictive layer; and 1.5 μm for the coupling member and the loosely bound layer. Moreover, the Young's modulus of the substrate was 120 GPa, that of the piezoelectric/electrostrictive layer was 55 GPa, and those for the coupling member and the loosely bound layer were 1.8 GPa, respectively. In addition, the maximum thickness at the edge of the protruded portion of the piezoelectric/electrostrictive layer of the coupling member was 10 μm, and the thickness of the loosely bound layer was 1 μm.

Evaluation

The piezoelectric/electrostrictive film device according to Comparative Example 1 which was not provided with a predetermined coupling member and a loosely bound layer had resonant frequency of 1.6 MHz and flexural displacement of 0.14 μm. Also, the piezoelectric/electrostrictive film device according to Comparative Example 2, which was provided with the coupling member and the loosely bound layer comprising polystyrene, had resonant frequency of 1.6 MHz and flexural displacement of 0.14 μm.

On the contrary, the piezoelectric/electrostrictive film device according to Example 1 which was provided with the coupling member and the loosely bound layer had flexural displacement of 0.14 μm, which is same as that of the piezoelectric/electrostrictive film devices according to Comparative Examples 1 and 2, but had resonant frequency of 1.7 MHz, which is larger by 6% than that of the piezoelectric/electrostrictive film devices according to Comparative Examples 1 and 2.

Example 2

A lower electrode comprising platinum (dimension: 1.2× 0.8 mm, thickness: 3 mm) was formed via screen printing on the $ZrO_2$ substrate stabilized with $Y_2O_3$ having a flat thinner portion (dimension of the thinner portion: 1.6×1.1 mm, thickness: 10 μm), and the resultant one was integrated with the substrate by thermal processing at 1300° C. for 2 hours.

Next, upon them, a first piezoelectric material comprising $Pb_{1.00}[(Mg_{0.80}Ni_{0.20})_{1/3}Nb_{2/3}]_{00.2}Ti_{0.48}Zr_{0.37}O_3$, was formed by employing screen printing to be layered within 1.3×0.9 mm to a thickness of 7 μm.

Next, an inner electrode comprising platinum (dimension: 1.0×1.1 mm, thickness: 3 μm) was layered via screen printing.

Further, a second piezoelectric material comprising 98.5% wt. of $Pb_{1.00}[(Mg_{0.80}Ni_{0.20})_{1/3}Nb_{2/3}]_{0.20}Ti_{0.43}Zr_{0.37}O_8$, and 1.5% wt. of NiO was formed thereon by employing screen printing to be layered within 1.3×0.9 mm to a thickness of 7 μm.

Next, an atmospheric controlling material having identical composition to the piezoelectric material was also provided in terms of NiO in volume per unit atmospheric volume of 0.15 mg/cm$^3$ within the vessel together with the resultant product, and the thermal processing was carried out at 1275° C. for 2 hours. Thickness of each of the thermally processed piezoelectric layers was 5 μm.

Next, an upper electrode comprising gold (dimension: 1.2×0.8 mm, thickness: 0.5 μm) was formed on the piezoelectric layer via screen printing, and thereafter, the thermal processing was carried out.

Next, the portion of the resultant device opposite to the surface on which the piezoelectric/electrostrictive layer and the electrodes were formed was fixed to a pedestal in a manner of being masked with an UV sheet, and an inorganic film coating liquid including $SiO_2$ as a major constituent (product name: Ceramate C-513, produced by CATALYSTS & CHEMICALS IND. CO. LTD., Viscosity (25° C.): not larger than 20 cP, pH (25° C.): 3–5, liquid specific gravity: 0.9–1.0 g/ml, solvent: isopropyl alcohol, water) was applied throughout the entire device by spin coating. In this case, the pedestal rotated at 500 rpm during the initial phase, and immediately after dropping the coating liquid, the rotation speed was increased to 2000 rpm, and the rotation was continued for 30 seconds.

Eventually, after stopping the rotation, the device coated with the inorganic film coating liquid was left at room temperature for 30 minutes, and thereafter the temperature was increased at a rate of 200° C./h, and then held a constant temperature of 80–120° C. for 1 hour, and thereafter the temperature was further increased continuously up to 300° C., and a cure process was accomplished at that temperature for 60 minutes to cure the coupling member coupling the entire protruded portion of the piezoelectric/electrostrictive layer and the substrate and the loosely bound layer covering the upper electrode to produce the multi-layer piezoelectric/electrostrictive film device.

The penetration depths of the Microvickers hardness indenter of each of the components of the resultant piezoelectric/electrostrictive film device were, as shown in FIG. 16: 0.18 μm for the substrate; 0.27 μm for the piezoelectric/electrostrictive layer; and 0.87 μm for the coupling member and the loosely bound layer. Moreover, the Young's modulus of the substrate was 120 GPa, that of the piezoelectric/electrostrictive layer was 55 GPa, and those for the coupling member and the loosely bound layer were 5.3 GPa, respectively. In addition, the maximum thickness at the edge of the protruded portion of the piezoelectric/electrostrictive layer of the coupling member was 5 μm, and the thickness of the loosely bound layer was 0.5 μm.

Comparative Example 3

A piezoelectric/electrostrictive film device similar to that of Example 1 was manufactured except that the predetermined inorganic film coating liquid was not applied, and the coupling member and loosely bound layer were not provided.

The penetration depths of the Microvickers hardness indenter of each of the components of the resultant piezoelectric/electrostrictive film device were 0.18 μm for the substrate and 0.27 μm for the piezoelectric/electrostrictive layer. Moreover, the Young's modulus of the substrate was 120 GPa, and that of the piezoelectric/electrostrictive layer was 55 GPa.

Evaluation

The piezoelectric/electrostrictive film device according to Comparative Example 3, which was not provided with a predetermined coupling member and a loosely bound layer, had a resonant frequency of 1.75 MHz and a flexural displacement of 0.16 μn.

On the contrary, the piezoelectric/electrostrictive film device according to Example 1, which was provided with the coupling member and the loosely bound layer, had a flexural displacement of 0.16 μm, which is same as that of the piezoelectric/electrostrictive film devices according to Comparative example 3, but had resonant frequency of 1.85 MHz, which is larger by 6% than that of the piezoelectric/electrostrictive film devices according to Comparative example 3.

Example 3

A piezoelectric/electrostrictive film device similar to that in Example 1 was manufactured except that an inorganic film coating liquid containing 0.1 mass % (equal to 0.003 to 0.005 mass % in terms of the solid fluorescent pigment) of a fluorescent pigment solution comprising the following composition (Neoglow water-washable fluorescent penetrative solution F-4A-C; manufactured by Eishin Chemical Co., Ltd.) was spin coated on the entire device.

Composition

The fluorescent pigment solution contained:
    10 to 20 mass % of an oily hydrocarbon A;
    30 to 40 mass % of an oily hydrocarbon B;
    5 to 15 mass % of a plastic solvent;

5 to 15 mass % of a nonionic surfactant A;

15 to 25 mass % of a nonionic surfactant B; and 3 to 5 mass % of a fluorescent pigment. The total mass % was adjusted to 100 mass %.

The resultant piezoelectric/electrostrictive film device was irradiated with Ultraviolet ray using an ultraviolet crack-detective light (Ultra light S-35, transmittable wave length: 320 to 400 nm (major wave length: 365 nm), ultraviolet ray intensity: 6000 μmW/cm$^3$), manufactured by Eishin Chemical Co., Ltd.) so as to examine the presence and the thickness of the coupling member and the loosely bound layer, respectively. As a result, the presence and the thickness of them were confirmed, respectively.

After confirming the formation of the coupling member and the loosely bound layer, the device was subjected to thermal processing with an increasing temperature at a rate of 200° C./h up to temperature of 400° C., and held at 400° C. for 60 minutes. The resultant device was subjected to the inspection as to the presence of the fluorescent pigment in the device by irradiating it with the ultraviolet crack-detective light. It was confirmed that there was present no fluorescent pigment in the device since no emission of the fluorescent ray was observed.

Furthermore, it was confirmed that the device showed similar penetration depths of Microvickers hardness indenter and the thickness of each of the components thereof the resultant piezoelectric/electrostrictive film device.

Example 4

A lower electrode comprising platinum (dimension: 1.2×0.8 mm, thickness: 3 mm) was formed by screen printing on a $ZrO_2$ substrate stabilized with $Y_2O_3$ having a flat thinner portion (dimension of the thinner portion: 1.6×1.1 mm, thickness: 10 μm), and integrated with the substrate by thermal processing at 1300° C. for 2 hours.

Next, upon them, a piezoelectric material comprising $(Pb_{0.999}La_{0.001})(Mg_{1/3}Nb_{2/3})_{0.375}Ti_{0.375}Zr_{0.250}O_3$ in which a portion of Pb is substituted by 0.1% by mol La, (mean particle size: 0.49 μm, maximum particle size: 1.8 μm) was formed by screen printing to be layered within 1.3×0.9 mm to a thickness of 20 μm.

Next, an atmospheric controlling material having identical composition to the piezoelectric material was also provided within the vessel, and the substrate being provided with the electrodes and stacked with the piezoelectric/electrostrictive layer thereon was subjected to the thermal processing at 1275° C. for 2 hours therein. Thickness of the thermally processed piezoelectric layers was 13 μm.

Next, an upper electrode comprising gold was formed on the piezoelectric layer by screen printing within a range of 1.2×0.8 mm in the thickness of 0.5 μm, and thereafter, thermal processing was carried out at 600° C. to obtain a piezoelectric/electrostrictive film device.

The thus obtained piezoelectric/electrostrictive film device was used under the practical conditions for a long period of time, and it showed an improved durability without formation of peeling off between the piezoelectric/electrostrictive layer and the electrodes.

Example 5

A lower electrode comprising platinum (dimension: 1.2×0.8 mm, thickness: 3 mm) was formed by screen printing on a $ZrO_2$ substrate stabilized with $Y_2O_3$ having a flat thinner portion (dimension of the thinner portion: 1.6×1.1 mm, thickness: 10 μm), and was integrated with the substrate by thermal processing at 1300° C. for 2 hours.

Next, upon them, a first piezoelectric material comprising $Pb_{1.00}[(Mg_{0.80}Ni_{0.20})_{1/3}Nb_{2/3}]_{0.20}Ti_{0.48}Zr_{0.37}O_3$, was formed by employing screen printing to be layered within 1.3×0.9 mm to a thickness of 7 μm.

Next, an inner electrode comprising platinum (dimension: 1.0×1.1 mm, thickness: 3 μm) was layered via screen printing.

Further, a second piezoelectric material comprising 98.5% wt. of $Pb_{1.00}[(Mg_{0.80}Ni_{0.20})_{1/3}Nb_{2/3}]_{0.20}Ti_{0.43}Zr_{0.37}O_8$, and 1.5% wt. of NiO was formed thereon by screen printing to be layered within 1.3×0.9 mm to a thickness of 7 μm.

Next, an atmospheric controlling material having identical composition to the piezoelectric material was also provided in terms of NiO in volume per unit atmospheric volume of 0.15 mg/cm$^3$ within the vessel together with the resultant product, and thermal processing was carried out at 1275° C. for 2 hours. The thickness of each of the thermally processed piezoelectric layers was 5 M.

Next, an upper electrode comprising gold (dimension: 1.2×0.8 mm, thickness: 0.5 μm) was formed on the piezoelectric layer by screen printing, and thereafter, thermal processing was carried out to obtain a multi-layered piezoelectric/electrostrictive film device.

Thus obtained piezoelectric/electrostrictive film device was used under the practical conditions for a long period of time, and it showed an improved durability without formation of peeling off between the piezoelectric/electrostrictive layer and the electrodes.

As described above, the present invention is capable of providing the piezoelectric/electrostrictive film device having a much larger resonant frequency, while having a flexural displacement that is equal to or superior to that of conventional piezoelectric/electrostrictive film device, and having an excellent rapid response.

What is claimed is:

1. A piezoelectric/electrostrictive film device comprising a ceramic substrate, and a piezoelectric/electrostrictive actuator including a laminate formed by sequentially layering at least one lower electrode, at least one piezoelectric/electrostrictive layer, and at least one upper electrode on said substrate, said at least one piezoelectric/electrostrictive layer covering an upper surface of said at least one lower electrode and a lower surface of said at least one upper electrode and including a protruded portion protruding beyond edges thereof;

wherein said protruded portion of said piezoelectric/electrostrictive layer is coupled to said substrate via a coupling member, such that said coupling member completely couples at least an entire lower portion of said protruded portion of said piezoelectric/electrostrictive layer to said substrate; and wherein a flexural displacement of said device is substantially the same as, and a resonant frequency of said device is at least 3% larger than, that of a piezoelectric/electrostrictive film device comprising the same materials and the same configuration as said device but not including said coupling member.

2. The piezoelectric/electrostrictive film device according to claim 1, wherein a penetration depth of a Microvickers hardness indenter into said coupling member is larger than that of the piezoelectric/electrostrictive layer and lower than 1.3 μm when measured by using a micro hardness tester and a Diamond Vickers indenter having a diagonal angle of 136 degrees at a load of 1 gf and a penetration speed of 0.145 gf/sec.

3. The piezoelectric/electrostrictive film device according to claim 1, wherein said coupling member of said piezoelectric/electrostrictive film device has a Young's modulus exceeding 2.4 GPa, but lower than that of said piezoelectric/electrostrictive layer.

4. A piezoelectric/electrostrictive film device comprising a ceramic substrate, and a piezoelectric/electrostrictive actuator including a laminate formed by sequentially layering at least one lower electrode, at least one piezoelectric/electrostrictive layer, and at least one upper electrode on said substrate, said at least one piezoelectric/electrostrictive layer covering an upper surface of said at least one lower electrode and a lower surface of said at least one upper electrode and including a protruded portion protruding beyond edges thereof;
- wherein said protruded portion of said piezoelectric/electrostrictive layer is coupled to said substrate via a coupling member;
- wherein a flexural displacement of said device is substantially the same as, and a resonant frequency of said device is at least 3% larger than, that of a piezoelectric/electrostrictive film device comprising the same materials and the same configuration as said device but not including said coupling member; and
- wherein said coupling member comprises an organic-inorganic hybridized material.

5. A piezoelectric/electrostrictive film device comprising a ceramic substrate, and a piezoelectric/electrostrictive actuator including a laminate formed by sequentially layering at least one lower electrode, at least one piezoelectric/electrostrictive layer, and at least one upper electrode on said substrate, said at least one piezoelectric/electrostrictive layer covering an upper surface of said at least one lower electrode and a lower surface of said at least one upper electrode and including a protruded portion protruding beyond edges thereof;
- wherein said protruded portion of said piezoelectric/electrostrictive layer is coupled to said substrate via a coupling member;
- wherein a flexural displacement of said device is substantially the same as, and a resonant frequency of said device is at least 3% larger than, that of a piezoelectric/electrostrictive film device comprising the same materials and the same configuration as said device but not including said coupling member;
- wherein a penetration depth of a Microvickers hardness indenter into said coupling member is larger than that of the piezoelectric/electrostrictive layer and lower than 1.3 μm when measured by using a micro hardness tester and a Diamond Vickers indenter having a diagonal angle of 136 degrees at a load of 1 gf and a penetration speed of 0.145 gf/sec; and
- wherein said coupling member comprises an organic-inorganic hybridized material.

6. The piezoelectric/electrostrictive film device according to claim 4, wherein an entirety of said protruded portion of said piezoelectric/electrostrictive layer is covered by said coupling member.

7. The piezoelectric/electrostrictive film device according to claim 1, wherein said coupling member contains a coloring agent.

8. The piezoelectric/electrostrictive film device according to claim 7, wherein said coloring agent is a fluorescent pigment.

9. The piezoelectric/electrostrictive film device according to claim 8, wherein said fluorescent pigment is an organic substance being removable by subjecting it to thermal processing at a temperature at which said organic substance is decomposed or higher.

10. The piezoelectric/electrostrictive film device according to claim 1, wherein said piezoelectric/electrostrictive actuator includes a laminate layer formed by alternately layering a predetermined number of lower electrodes, a predetermined number of piezoelectric/electrostrictive layers, and a predetermined number of upper electrodes in order on said substrate.

11. A piezoelectric/electrostrictive film device according to claim 2, wherein said piezoelectric/electrostrictive actuator includes a laminate layer formed by alternately layering a predetermined number of lower electrodes, a predetermined number of piezoelectric/electrostrictive layers, and a predetermined number of upper electrodes in order on said substrate.

12. A piezoelectric/electrostrictive film device comprising a ceramic substrate, and a piezoelectric/electrostrictive actuator including a laminate formed by sequentially layering at least one lower electrode, at least one piezoelectric/electrostrictive layer, and at least one upper electrode on said substrate, said at least one piezoelectric/electrostrictive layer covering an upper surface of said at least one lower electrode and a lower surface of said at least one upper electrode and including a protruded portion protruding beyond edges thereof;
- wherein said protruded portion of said piezoelectric/electrostrictive layer is coupled to said substrate via at least one coupling member;
- wherein a flexural displacement of said device is substantially the same as, and a resonant frequency of said device is at least 3% larger than, that of a piezoelectric/electrostrictive film device comprising the same materials and the same configuration as said device but not including said coupling member; and
- wherein a plurality of piezoelectric/electrostrictive actuators are provided on the substrate, and at least two adjacent piezoelectric/electrostrictive actuators are coupled with said at least one coupling member.

13. A piezoelectric/electrostrictive film device comprising a ceramic substrate, and a piezoelectric/electrostrictive actuator including a laminate formed by sequentially layering at least one lower electrode, at least one piezoelectric/electrostrictive layer, and at least one upper electrode on said substrate, said at least one piezoelectric/electrostrictive layer covering an upper surface of said at least one lower electrode and a lower surface of said at least one upper electrode and including a protruded portion protruding beyond edges thereof;
- wherein said protruded portion of said piezoelectric/electrostrictive layer is coupled to said substrate via at least one coupling member;
- wherein a flexural displacement of said device is substantially the same as, and a resonant frequency of said device is at least 3% larger than, that of a piezoelectric/electrostrictive film device comprising the same materials and the same configuration as said device but not including said coupling member;
- wherein a penetration depth of a Microvickers hardness indenter into said coupling member is larger than that of the piezoelectric/electrostrictive layer and lower than 1.3 μm when measured by using a micro hardness tester and a Diamond Vickers indenter having a diagonal angle of 136 degrees at a load of 1 gf and a penetration speed of 0.145 gf/sec; and wherein a plurality of piezoelectric/electrostrictive actuators are provided on said substrate, and at least two adjacent piezoelectric/electrostrictive actuators are coupled with said at least one coupling member.

14. A piezoelectric/electrostrictive film device comprising a ceramic substrate, and a piezoelectric/electrostrictive actuator including a laminate formed by sequentially layering at least one lower electrode, at least one piezoelectric/electrostrictive layer, and at least one upper electrode on said substrate, said at least one piezoelectric/electrostrictive layer covering an upper surface of said at least one lower electrode and a lower surface of said at least one upper electrode and including a protruded portion protruding beyond edges thereof;

wherein said protruded portion of said piezoelectric/electrostrictive layer is coupled to said substrate via at least one coupling member;

wherein a flexural displacement of said device is substantially the same as, and a resonant frequency of said device is at least 3% larger than, that of a piezoelectric/electrostrictive film device comprising the same materials and the same configuration as said device but not including said coupling member;

wherein a plurality of piezoelectric/electrostrictive actuators are provided at a predetermined interval on said substrate; and wherein said at least one coupling member includes a portion formed on an upper surface of said substrate between said at least two adjacent piezoelectric/electrostrictive actuators.

15. A piezoelectric/electrostrictive film device comprising a ceramic substrate, and a piezoelectric/electrostrictive actuator including a laminate formed by sequentially layering at least one lower electrode, at least one piezoelectric/electrostrictive layer, and at least one upper electrode on said substrate, said at least one piezoelectric/electrostrictive layer covering an upper surface of said at least one lower electrode and a lower surface of said at least one upper electrode and including a protruded portion protruding beyond edges thereof;

wherein said protruded portion of said piezoelectric/electrostrictive layer is coupled to said substrate via at least one coupling member;

wherein a flexural displacement of said device is substantially the same as, and a resonant frequency of said device is at least 3% larger than, that of a piezoelectric/electrostrictive film device comprising the same materials and the same configuration as said device but not including said coupling member;

wherein a penetration depth of a Microvickers hardness indenter into said coupling member is larger than that of the piezoelectric/electrostrictive layer and lower than 1.3 µm when measured by using a micro hardness tester and a Diamond Vickers indenter having a diagonal angle of 136 degrees at a load of 1 gf and a penetration speed of 0.145 gf/sec;

wherein a plurality of piezoelectric/electrostrictive actuators are provided at a predetermined interval on said substrate; and wherein said at least one coupling member includes a portion formed on an upper surface of said substrate between said at least two adjacent piezoelectric/electrostrictive actuators.

16. The piezoelectric/electrostrictive film device according to claim 5, wherein an entirety of said protruded portion of said piezoelectric/electrostrictive layer is covered by said coupling member.

17. The piezoelectric/electrostrictive film device according to claim 4, wherein a penetration depth of a Microvickers hardness indenter into said coupling member is larger than that of said piezoelectric/electrostrictive layer and lower than 1.3 µm when measured by using a micro hardness tester and a Diamond Vickers indenter having a diagonal angle of 136 degrees at a load of 1 gf and a penetration speed of 0.145 gf/sec.

18. The piezoelectric/electrostrictive film device according to claim 4, wherein said coupling member of said piezoelectric/electrostrictive film device has a Young's modulus exceeding 2.4 GPa, but lower than that of said piezoelectric/electrostrictive layer.

19. The piezoelectric/electrostrictive film device according to claim 4, wherein said coupling member contains a coloring agent.

20. The piezoelectric/electrostrictive film device according to claim 19, wherein said coloring agent is a fluorescent pigment.

21. The piezoelectric/electrostrictive film device according to claim 20, wherein said fluorescent pigment is an organic substance being removable by subjecting it to thermal processing at a temperature at which said organic substance is decomposed or higher.

22. The piezoelectric/electrostrictive film device according to claim 5, wherein said piezoelectric/electrostrictive actuator includes a laminate layer formed by alternately layering a predetermined number of lower electrodes, a predetermined number of piezoelectric/electrostrictive layers, and a predetermined number of upper electrodes in order on said substrate.

* * * * *